United States Patent
Misono

(10) Patent No.: US 10,486,359 B2
(45) Date of Patent: Nov. 26, 2019

(54) METHOD FOR MANUFACTURING DISPLAY APPARATUS, DISPLAY APPARATUS, AND FILM DEVICE

(71) Applicant: Sharp Kabushiki Kaisha, Osaka-shi, Osaka (JP)

(72) Inventor: Kenji Misono, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 876 days.

(21) Appl. No.: 14/889,226

(22) PCT Filed: Feb. 24, 2014

(86) PCT No.: PCT/JP2014/000952
§ 371 (c)(1),
(2) Date: Nov. 5, 2015

(87) PCT Pub. No.: WO2014/188636
PCT Pub. Date: Nov. 27, 2017

(65) Prior Publication Data
US 2016/0089831 A1 Mar. 31, 2016

(30) Foreign Application Priority Data
May 21, 2013 (JP) ................................. 2013-107314

(51) Int. Cl.
*B29C 53/04* (2006.01)
*B29C 35/02* (2006.01)
(Continued)

(52) U.S. Cl.
CPC .............. *B29C 53/04* (2013.01); *B29C 35/02* (2013.01); *B29C 53/066* (2013.01); *B29C 65/02* (2013.01);
(Continued)

(58) Field of Classification Search
CPC ....... B29C 35/02; B29C 53/04; B29C 53/066; B65H 45/04
See application file for complete search history.

(56) References Cited

U.S. PATENT DOCUMENTS 5,066,351 A * 11/1991 Knoll ...................... B29C 43/04
156/212
2003/0134488 A1 7/2003 Yamazaki et al.
(Continued)

FOREIGN PATENT DOCUMENTS

| JP | 2010-135802 A | 6/2010 | |
| JP | 2010-258037 | * 11/2010 | ............. H01L 27/32 |
| JP | 2010-258037 A | 11/2010 | |

OTHER PUBLICATIONS

Official Communication issued in International Patent Application No. PCT/JP2014/000952, dated Mar. 25, 2014.

*Primary Examiner* — Benjamin A Schiffman
(74) *Attorney, Agent, or Firm* — Keating & Bennett, LLP

(57) ABSTRACT

Prepared is a film device (FD) in which a first thermoplastic film (141), a device layer (110) (i.e., a multi-layer product including a polyimide film and a device body), and a second thermoplastic film (142) are arranged. The film device (FD) is pressed against a forming mold (150) and heated at a lower temperature than the temperature limit of the polyimide film, such that the first thermoplastic film is stretched to conform to the shape of the forming mold (150).

16 Claims, 20 Drawing Sheets

(51) Int. Cl.
  *B65H 45/04* (2006.01)
  *H01L 21/683* (2006.01)
  *B29C 53/06* (2006.01)
  *H01L 29/786* (2006.01)
  *H01L 27/12* (2006.01)
  *G02F 1/1333* (2006.01)
  *B29C 65/02* (2006.01)
  *B29C 65/00* (2006.01)
  *B29C 70/68* (2006.01)
  *B32B 27/08* (2006.01)
  *B32B 27/34* (2006.01)
  *B32B 7/12* (2006.01)
  *B32B 23/08* (2006.01)
  *B32B 23/20* (2006.01)
  *B32B 27/06* (2006.01)
  *B32B 27/28* (2006.01)
  *B32B 27/30* (2006.01)
  *B32B 27/32* (2006.01)
  *B32B 27/36* (2006.01)
  *B29K 101/12* (2006.01)
  *B29K 679/00* (2006.01)
  *B29L 31/34* (2006.01)

(52) U.S. Cl.
  CPC ............ *B29C 66/45* (2013.01); *B29C 70/685* (2013.01); *B32B 7/12* (2013.01); *B32B 23/08* (2013.01); *B32B 23/20* (2013.01); *B32B 27/06* (2013.01); *B32B 27/08* (2013.01); *B32B 27/281* (2013.01); *B32B 27/302* (2013.01); *B32B 27/304* (2013.01); *B32B 27/306* (2013.01); *B32B 27/308* (2013.01); *B32B 27/32* (2013.01); *B32B 27/34* (2013.01); *B32B 27/36* (2013.01); *B32B 27/365* (2013.01); *B65H 45/04* (2013.01); *G02F 1/133305* (2013.01); *H01L 21/6835* (2013.01); *H01L 27/1218* (2013.01); *H01L 29/78603* (2013.01); *B29K 2101/12* (2013.01); *B29K 2679/08* (2013.01); *B29L 2031/3475* (2013.01); *B32B 2274/00* (2013.01); *B32B 2457/20* (2013.01); *B32B 2457/202* (2013.01); *B32B 2457/208* (2013.01); *H01L 2221/6835* (2013.01); *H01L 2221/68318* (2013.01); *H01L 2221/68363* (2013.01); *H01L 2221/68381* (2013.01)

(56) References Cited

U.S. PATENT DOCUMENTS

2010/0178722 A1* 7/2010 de Graff ........... H01L 27/14618
  438/65
2014/0042406 A1* 2/2014 Degner ................. H01L 27/326
  257/40

* cited by examiner

METHOD FOR MANUFACTURING DISPLAY APPARATUS, DISPLAY APPARATUS, AND FILM DEVICE

TECHNICAL FIELD

The present invention relates to methods for manufacturing display apparatuses and, in particular, to a method for manufacturing which allows the shape of a display panel to reflect various designs.

BACKGROUND ART

Recent years have seen an increase in the request for various design choices of display apparatuses. Many selections of designs have been sought for the shapes of the display panels. Examples of the designs are those for a display apparatus having a curved display surface, and a display apparatus designed to have integrated multiple faces.

For example, Patent Document 1 discloses a method for preparing a light-emitting device having a desired curvature. In this preparing method, first, an external force is applied to a support originally having a curvature and elasticity. This support is bonded to a release layer prepared on a substrate. After that, when the substrate is released, the support returns to the original shape by the restoring force, and the release layer curves in conformity with the shape of the support. Finally, Patent Document 1 discloses that a transfer object originally having a curvature is bonded to the release layer, and a device having a desired curvature is obtained.

CITATION LIST

Patent Document

Patent Document 1: Japanese Patent Application No. 2010-135802

SUMMARY OF THE INVENTION

Technical Problem

The method for preparing the display apparatus disclosed in Patent Document 1, however, merely involves curving a flexible display panel formed on a flat surface into the shape of the support. Hence, the display panel has a difficulty in fitting onto a curved surface having two or more bent axes. Moreover, if multiple display panels are provided, for each of the faces, to the housing of the display apparatus, seams appears between the neighboring display panels. Because of those seams, the display apparatus hardly look sophisticated. Hence, Patent Document 1 still has a problem that the disclosed display apparatus lacks design flexibility of its display surface.

In view of the forgoing background, it is therefore an object of the present invention to provide a method for manufacturing a display apparatus having a display panel of which the shape may reflect a complex design.

Solution to the Problem

In order to solve the above problems, a method for manufacturing a display apparatus comprises: preparing a film device including a device layer arranged on a first thermoplastic film, the device layer being a multi-layer product including a polyimide film and a device body, and the polyimide film being sandwiched between the device body and the first thermoplastic film; heating the first thermoplastic film of the film device when the first thermoplastic film is pressed against a forming mold, so as to stretch the first thermoplastic film to conform to a shape of the forming mold; and removing the forming mold from the first thermoplastic film of the film device, wherein the heating is performed at a temperature lower than a temperature limit of the polyimide film.

In the method for manufacturing the display apparatus according to the present invention, the preparing may beneficially include: sequentially forming and stacking a sacrificial film, a polyimide film, and a device body on the supporting substrate; removing the supporting substrate and the sacrificial film from the device layer, through emission of a laser beam onto the sacrificial film; and applying the first thermoplastic film to the polyimide film of the device layer.

In the method for manufacturing the display apparatus according to the present invention, the film device may further include a second thermoplastic film such that the device layer is sandwiched between the first and second thermoplastic films.

In the method for manufacturing the display apparatus according to the present invention, the heating may beneficially be performed at a temperature ranging from 80° C. to 250° C.

In the method for manufacturing the display apparatus according to the present invention, the first thermoplastic film may be formed of one of polyethylene, polypropylene, polyvinyl chloride, polystyrene, styrene-acrylonitrile copolymer, acrylonitule butadiene styrene copolymer, polyethylene terephthalate, polymethylmethacrylate, methacrylate styrene copolymer, acetylcellulose, polyvinyl alcohol, polyvinylidene chloride, and polycarbonate.

In the method for manufacturing the display apparatus according to the present invention, the device layer may be provided to two regions of the first thermoplastic film, each of the two regions corresponding to one of two adjacent faces of the forming mold, to one region of the first thermoplastic film, the one region corresponding to two adjacent faces of the forming mold, to a region of the first thermoplastic film, the region corresponding to an edge of the forming mold, and to a region of the first thermoplastic film, the region corresponding to a corner of the forming mold.

In the method for manufacturing the display apparatus according to the present invention, the device layer may be a liquid crystal display panel, an organic electroluminescence (EL) display panel, a touch panel, and a light-emitting diode (LED).

The display apparatus according to the present invention is prepared based on the method for manufacturing the above-described display apparatus according to the present invention.

A film device according to the present invention includes: a first thermoplastic film; and a device layer which is a multi-layer product provided on the first thermoplastic film and including a polyimide film and a device body, wherein he device layer is arranged such that the polyimide film is sandwiched between the device body and the first thermoplastic film.

Advantages of the Invention

The present invention allows for facilitating the preparation of a display apparatus having a typically difficult shape to prepare, such as a surface curved into two-axis directions, and a shape with the combination of a flat surface and a curved surface. Consequently, the present invention allows for preparing a display apparatus among various design choices.

Moreover, even if a display apparatus has a display surface or an input surface across multiple faces, the present invention enables providing the display apparatus with a sophisticated design without seams.

DESCRIPTION OF EMBODIMENTS

Embodiments of the present invention will now be described in detail, with reference to the drawings.

First Embodiment

Figure 1:
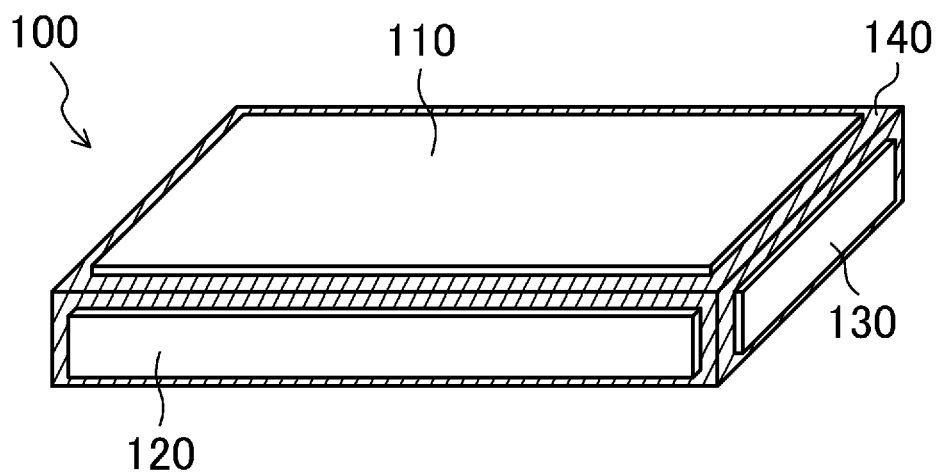
FIG. 1 is a perspective view of a display apparatus according to a first embodiment.

FIG. 1 illustrates a display apparatus 100 according to a first embodiment. This display apparatus is used for smart phones, tablet PCs, and handheld game consoles, for example. The display apparatus 100 is shaped into an approximate cuboid. When the display apparatus 100 is used for a smart phone having a five-inch and full-HD display, for example, the cuboid-shaped display apparatus 100 has a length ranging from 138 mm to 144 mm, a width ranging from 67 mm to 72 mm, and a height ranging from 7 mm to 11 mm. Furthermore, when the display apparatus 100 is used for a handheld game console, for example, the cuboid-shaped display apparatus 100 has a length ranging from 67 mm to 75 mm, a width ranging from 165 mm to 175 mm, and a height ranging from 16 mm to 21 mm. Moreover, when the display apparatus 100 is used for a 7-inch tablet PC, for example, the cuboid-shaped display apparatus 100 has a length ranging from 189 mm to 210 mm, a width ranging from 106 mm to 138 mm, and a height ranging from 7 mm to 13 mm Note that the sizes of the display apparatus shall not be limited to these figures. The display apparatus 100 has device layers 110, 120, and 130 provided to respective three faces out of six faces of a housing body 140 shaped into the cuboid. The device layers 110, 120, and 130 respectively includes a liquid crystal display (LCD) panel having a touch panel, an LCD panel, and an input device.

Figure 2:
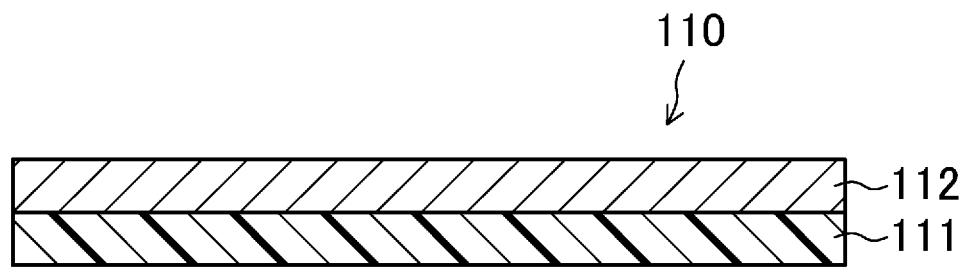
FIG. 2 is a general cross-sectional view of a film device according to the first embodiment.

As illustrated in FIG. 2, the device layer 110 is configured to have a device body 112 stacked on a polyimide film 111. Here, the device body 112 is an LCD panel having a touch panel. In a similar manner, each of the device layers 120 and 130 is configured to have a device body (i.e., an LCD panel, and an input device) stacked on a polyimide film.

The polyimide film 111 is formed of polyimide. Beneficially, the polyimide film 111 has a thickness of 5 μm or thicker. More beneficially, the polyimide film 111 has a thickness of 8 μm or thicker. If the polyimide film 111 is excessively thin, the polyimide film 111 could be broken after removed from a glass substrate, and could be affected by foreign matter during a process. Moreover, beneficially, the polyimide film 111 has a thickness of 15 µm or thinner. More beneficially, the polyimide film 111 has a thickness of 12 µm or thinner. If the polyimide film 111 is excessively thick, the glass substrate could warp during a device preparing process, causing a transportation problem. The polyimide film 111 has a temperature limit ranging from 350° C. to 500° C., for example. Note that the temperature limit of the polyimide film 111 here means that a temperature at which the polyimide thermally decomposes and an organic component is not produced. Specifically, in the process of baking at a high temperature, the temperature limit is a temperature at which the polyimide thermally decomposes. Moreover, in a process in which the adjustment of measurement precision is mandatory, such as mounting on a flexible printed circuit (FPC), the temperature limit of the polyimide depends on a liner coefficient of expansion.

The LCD panel having a touch panel and provided to the device layer 110 is embodied as, for example, an LCD panel, and a touch panel stacked on the LCD panel via, for example, an adhesive agent. Here, the LCD panel includes pixels each driven by a thin-film transistor (TFT). The TFT, LCD panel, and touch panel may be configured, using a well-known technique. The LCD panel having a touch panel has a thickness ranging from 0.24 mm to 0.62 mm, for example.

The LCD panel provided to the device layer 120 is, for example, an LCD panel of which pixels are each driven by a TFT. The TFT and LCD panel may be configured, using a well-known technique. The LCD panel has a thickness ranging from 0.20 mm to 0.53 mm, for example.

The input device provided to the device layer 130 includes, for example, a capacitance-type touch panel or a touch panel including a resistor divider. The capacitance-type touch panel or the touch panel including a resistor divider may be configured, using a well-known technique. The input device has a thickness ranging from 0.01 mm to 0.02 mm, for example. An exemplary function of the input device is to change the volume of the sound to be outputted by the display apparatus based on a detected input position.

The housing body 140 is embodied as thermoplastic films 141 and 142. The thermoplastic films 141 and 142 are embodied as a transparent film made of, for example, polyethylene (i.e., PE, EVA), polypropylene (i.e., PP), polyvinyl chloride (i.e., PVC), polystyrene (i.e., PS), styrene-acrylonitrile copolymer (i.e., AS), acrylonitule butadiene styrene copolymer (i.e., ABS), polyethylene terephthalate (i.e., PET), polymethylmethacrylate (i.e., PMMA), methacrylate styrene copolymer (i.e., MS), acetylcellulose (i.e., CA), polyvinyl alcohol (i.e., PVA), polyvinylidene chloride (i.e., PVDC), and polycarbonate (i.e., PC). The thermoplastic films 141 and 142 have a thickness ranging from 30 µm to 300 µm, for example. Exemplary properties of the thermoplastic films 141 and 142 allow the films to soften under a high temperature ranging from 80° C. to 220° C., and to return to their original film shapes under a temperature lower than the high temperature range. If transparency is particularly needed for the thermoplastic films 141 and 142, the films may be embodied as a film made of, for example, PET (i.e., a softening temperature ranging from 210° C. to 220° C. in the case of a stretched sheet and approximately 70° C. in the case of a non-stretched sheet), PMMA (i.e., a softening temperature ranging from 80° C. to 100° C.), PVDC (i.e., a softening temperature ranging from 140° C. to 160° C.), and PC (i.e., a softening temperature ranging from 130° C. to 140° C.). Note that the thermoplastic films 141 and 142 do not have to be transparent.

Regions of the thermoplastic films 141 and 142 are colored black, for example. Here, the colored regions are other than the regions provided with the LCD panel having a touch panel, the LCD panel, and the input device. Moreover, the regions of the thermoplastic films 141 and 142, to which the LCD panel having a touch panel, the LCD panel and the input device are provided, are transparent. Note that the process to color the thermoplastic films are not mandatory.

The thickness and electric properties such as permittivity for the thermoplastic films 141 and 142 need to be selected so as not to lose features of the LCD panel having a touch panel and of the touch panel configured to function as the input device.

(Method for Manufacturing Display Apparatus)

Described next is a method for manufacturing the display apparatus 100 according to the first embodiment. This manufacturing method includes a preparing step, a heating step, and a removing step.

(Preparing Step)

Prepared first is a supporting substrate 116 such as a glass substrate. Beneficially, the supporting substrate 116 is transparent. The supporting substrate 116 has a thickness ranging from 0.4 mm to 1.1 mm, for example.

Figure 3A:
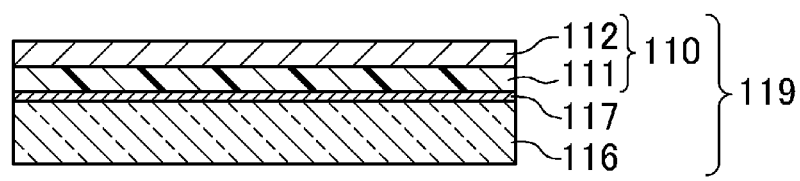
FIGS. 3A to 3C illustrate a preparing step in a method for manufacturing the display apparatus according to the first embodiment.

Next, as illustrated in FIG. 3A, a sacrificial film 117 is formed on the supporting substrate 116. The sacrificial film 117 is made of a material which may be vaporized by irradiation of a laser, for example. Specifically, the sacrificial film 117 is formed of a metal film including molybdenum (i.e., Mo), titanium (i.e., Ti), aluminum (i.e., Al), and tungsten (W), and of a silicon film including amorphous silicon (α-Si). If the sacrificial film 117 is formed of a metal film, the thickness of the sacrificial film 117 ranges from 100 nm to 300 nm, for example. Moreover, if the sacrificial film 117 is formed of a silicon film, the thickness of the sacrificial film 117 ranges from 100 nm to 200 nm, for example. If the sacrificial film 117 is a metal film, the metal sacrificial film 117 is formed by sputtering. Furthermore, if the sacrificial film 117 is a silicon film, the silicon sacrificial film 117 is formed by chemical vapor deposition (CVD) and sputtering, for example.

In a similar manner, sacrificial films 127 and 137 are respectively formed on supporting substrates 126 and 136 for the LCD panel and the input device (hereinafter, sacrificial films are formed in a similar manner unless otherwise noted in particular).

After that, as illustrated in FIG. 3A, the polyimide film 111 is formed on the sacrificial film 117. The polyimide film 111 is formed, using, for example, die coating, spin coating, roll coating, or offset-gravure coating. Then, the device body 112 (i.e., an LCD panel) is formed to further cover the polyimide film 111. The device body 112 is formed by a known art. Finally obtained is a multi-layer product 119 including the supporting substrate 116, the sacrificial film 117, and the device layer 110. Obtained in a similar manner are: a multi-layer product 129 including the supporting substrate 126, the sacrificial film 127, and the device layer 120; and a multi-layer product 139 including the supporting substrate 136, the sacrificial film 137, and the device layer 130.

Figure 3B:
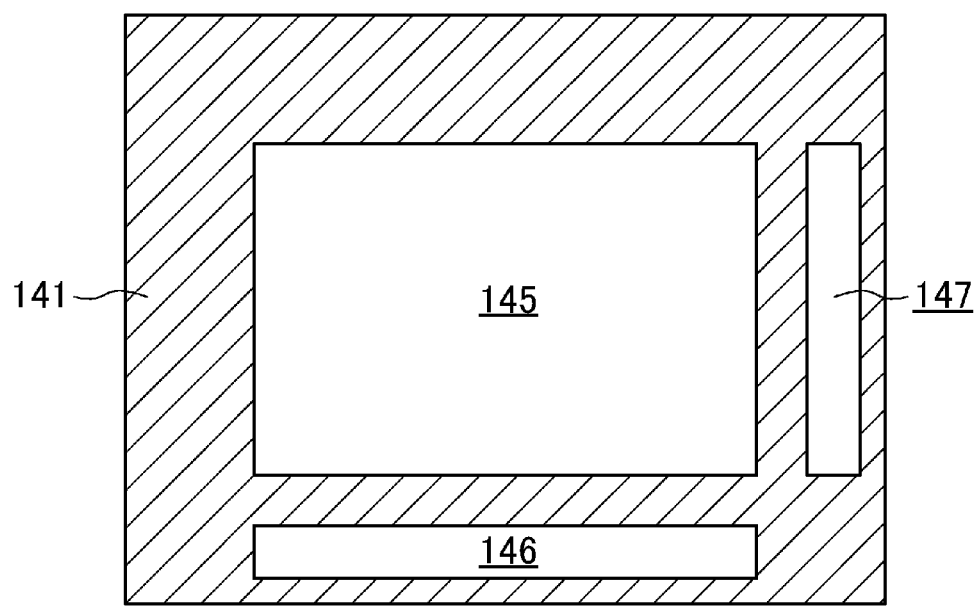

Meanwhile, a region of the thermoplastic film 141 may be colored black using pigment ink, for example. Here, the colored region is other than the regions provided with the LCD panel having a touch panel, the LCD panel, and the input device. Here, the thermoplastic film 141 is colored by screen printing, offset printing, or ink-jet printing, for example. Hence, as illustrated in FIG. 3B, regions of the thermoplastic film 141, which are to be provided with the LCD panel having a touch panel, the LCD panel, and the input device, are left as regions 145, 146, and 147. Note that FIG. 3B is a plan view. For the sake of convenience, however, the region colored black is shaded (hereinafter, FIGS. 4A, 7B, 9B, 14B, 19B, and 24B are illustrated in a similar manner).

Figure 3C:
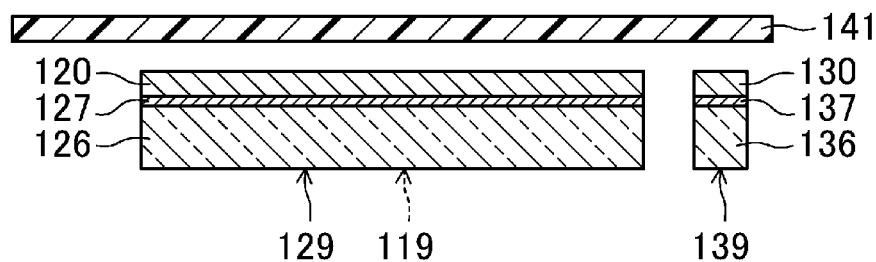

Next, as illustrated in FIG. 3C, the multi-layer products 119, 129, and 139 are respectively positioned to the regions 145, 146, and 147 of the thermoplastic film 141. Then, as illustrated in the plan view in FIG. 4A and the elevation view in FIG. 4B, the thermoplastic film 141 is applied to the surfaces of the multi-layer products 119, 129, and 139. In the application, the thermoplastic film 141 is laminated using a pressure roller pressing the thermoplastic film 141 against the multi-layer products 119, 129, and 139. The conditions here are (i) under an atmosphere of 1 pa to 50 Pa ranging from vacuum to an atmospheric pressure and having a temperature ranging from a room temperature to 140° C., and (ii) a pressure to be applied ranging from 0.1 MPa to 2 MPa. Here, an adhesive agent or a sticking agent may be sandwiched between the thermoplastic film 141 and the multi-layer products 119, 129, and 139, as needed basis. Examples of the "as needed basis" include a case where a cushion such as an adhesive agent and a sticking agent is needed for the protection of the product. The adhesive agent and the sticking agent may be either liquid or sheet shaped. Beneficially, the adhesive agent and the sticking agent may be liquid if the surfaces of the multi-layer products 119, 129, and 139 are not flat. The adhesive agent and the sticking agent may beneficially be sheet shaped if the surfaces of the multi-layer products 119, 129, and 139 are flat, and if the costs of materials and the takt time are prioritized.

Figure 4A:
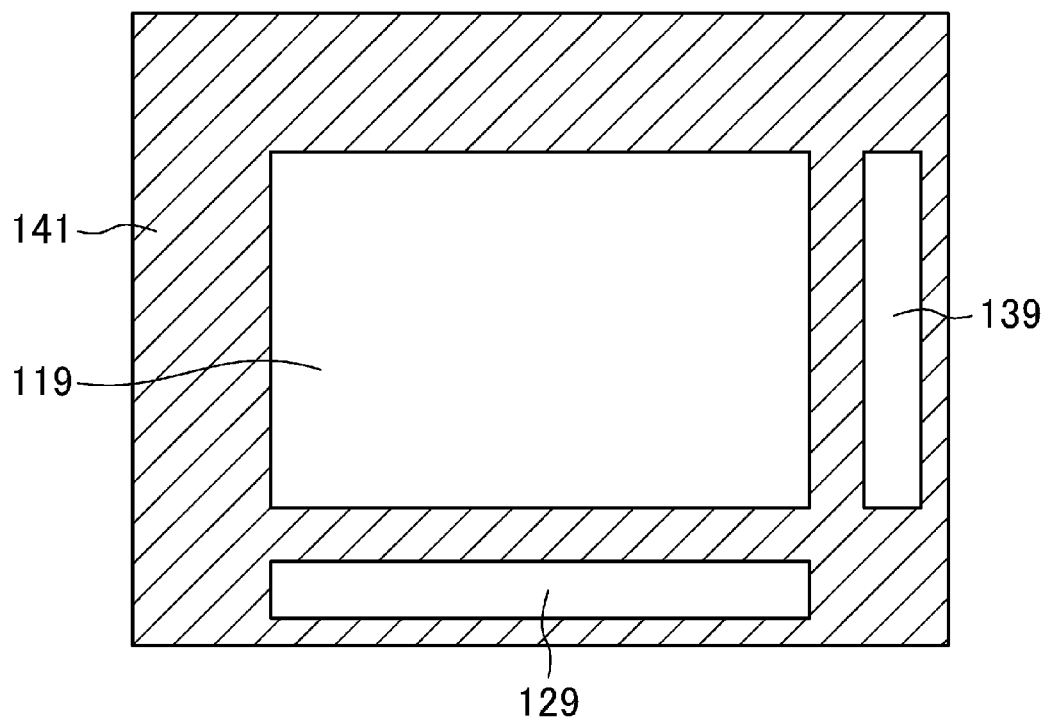
FIGS. 4A and 4B illustrate the preparing step in the method for manufacturing the display apparatus according to the first embodiment.
Figure 4B:
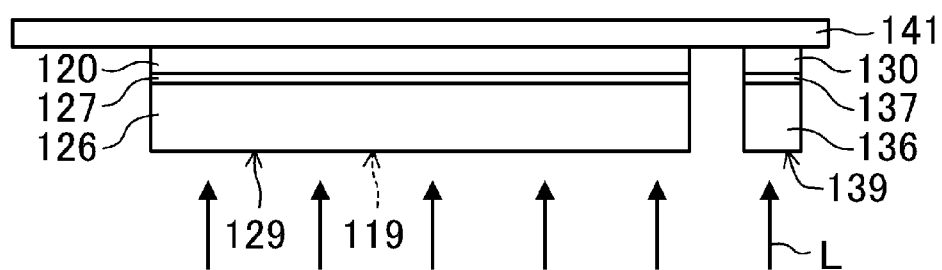
Figure 5A:
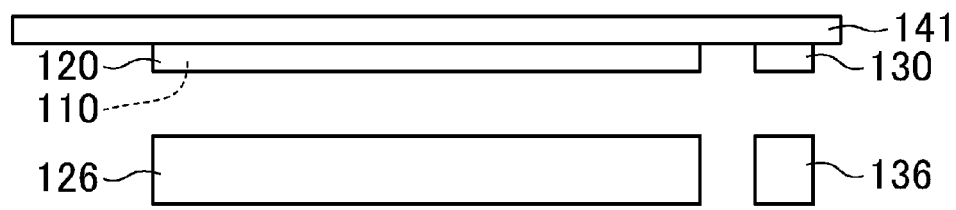
FIGS. 5A and 5B illustrate the preparing step in the method for manufacturing the display apparatus according to the first embodiment.

Next, as illustrated in FIG. 4B, a laser beam L is emitted onto the supporting substrates 116, 126, and 136 of the multi-layer products 119, 129, and 139. This allows for the sublimation of the sacrificial films 117, 127, and 137. Then, as illustrated in FIG. 5A, the supporting substrates 116, 126, and 136 and the sacrificial films 117, 127, and 137 are removed.

Here, the emitted laser L is an $YVO_4$ laser (a second harmonic) having a wavelength of, for example, 532 nm. An example of the emitting condition here may be a power of 6 W·35%, a pulse wavelength of 120 KHz, and a scanning speed of 2,400 mm/s Note that, other than the $YVO_4$ laser (a second harmonic) having the wavelength of 532 nm, examples of the lasers to be used include an He—Ne laser having a wavelength of 632.8 nm, an YAG-SHG laser having a wavelength of 532 nm, a ruby laser having a wavelength of 694.3 nm, and an excimer XeF laser having a wavelength of 350 nm.

Figure 5B:
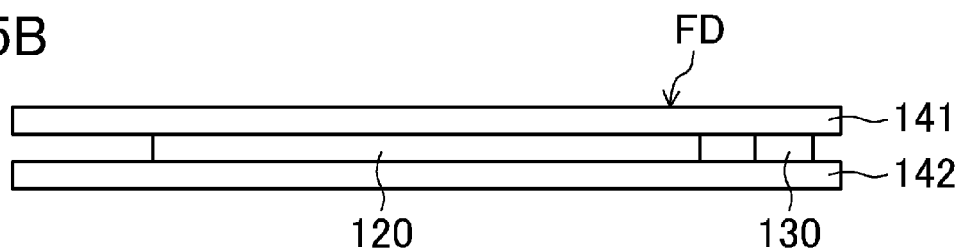

Then, as illustrated in FIG. 5B, the thermoplastic film 142 (i.e., a second thermoplastic film) is applied to multi-layer products, including the thermoplastic film 141 and the device layers 110, 120, and 130, in order to cover the device layers 110, 120, and 130. Here, the supporting substrates 116, 126, and 136, and the sacrificial films 117, 127, and 137 have been removed from the multi-layer products. In the application, the thermoplastic film 142 is laminated using a pressure roller pressing the thermoplastic film 142 against the multi-layer products including the thermoplastic film 141 and the device layers 110, 120, and 130. The conditions here are (i) under an atmosphere of 1 Pa to 50 Pa ranging from vacuum to an atmospheric pressure, and having a temperature ranging from a room temperature to 140° C., and (ii) a pressure to be applied ranging from 0.1 MPa to 2 MPa. Finally obtained is a film device FD embodied as the device layers 110, 120, and 130 sandwiched between the two thermoplastic films 141 and 142. Note that the thermoplastic film 142 does not have to be completely applied. Instead, the thermoplastic film 142 may tentatively be applied. This is because the two thermoplastic films 141 and 142 are brought together in the subsequent heating step.

The thermoplastic film 142 to be used here has a thickness ranging from 30 μm to 300 μm, for example. The thermoplastic film 142 and the thermoplastic film 141 may be either the same, or different, in property. For example, when the film device FD is curved, the thermoplastic film 142 beneficially has a property to allow the film to easily flex as a thermoplastic film placed to the concave side of the film device.

(Heating Step)

Figure 6A:
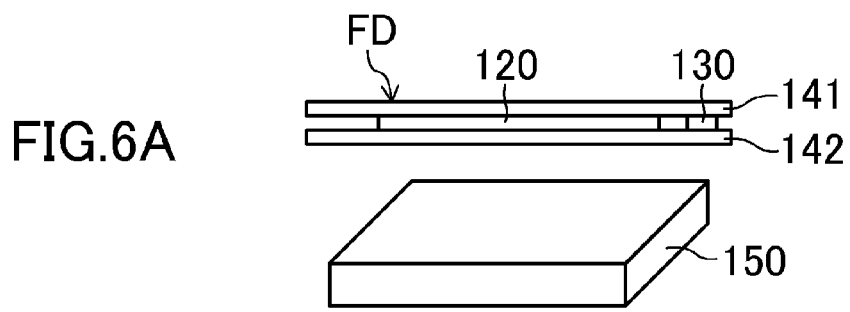
FIGS. 6A and 6B illustrate a heating step and FIG. 6C to 6E illustrate a removing step in the method for manufacturing the display apparatus according to the first embodiment.
Figure 6B:
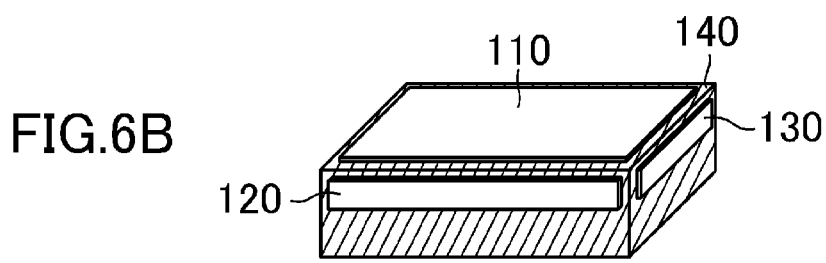

As illustrated in FIG. 6A, after the preparing step, prepared is a forming mold 150 of which the shape conforms to that of the display apparatus 100. The forming mold 150 is formed of, for example, metal or plaster. The forming mold 150 may be hollow or solid. Beneficially, the forming mold 150 is previously annealed to maintain its precision under repeated use. Furthermore, beneficially, the forming mold 150 is burred to facilitate die cutting. Then, as illustrated in FIG. 6B, the film device FD is placed to cover the forming mold 150, and then heated and pressurized to be stretched by vacuum forming Here, the thermoplastic films 141 and 142 melt and soften when heated, and are formed to conform to the shape of the forming mold 150 when pressurized and pressed against the forming mold 150. Moreover, the two thermoplastic films 141 and 142 are brought together when heated.

As to forming of the film device FD in detail, the film device FD may be formed by vacuum forming Specifically, the air in the space between the film device FD and the forming mold 150 is evacuated through a hole and a slit provided to the forming mold 150, and the film device FD is sucked to the forming mold 150 to have a shape. Note that, other than vacuum forming, the film device FD is formed by, for example, compression molding and match molding. If the film device FD is formed by compression molding, the device is pressure-bonded to the forming mold 150 by compressed air to have a shape. If the film device FD is formed by match molding, the device is sandwiched between a pair of male and female molds and pressed to have a shape.

Note that the surface of the film device FD is coated with the thermoplastic film 141 or the thermoplastic film 142. In order to clearly show the positions of the device layers 110, 120, and 130, the device layers 110 120, and 130 in FIG. 6B are illustrated on the surface of the film device FD (other than FIG. 6B, the device layers 110, 120, and 130 in FIGS. 1, 6, 8, 12B, 13, 17B, 18, 22B, 23, 27B, 28, and 29 are also illustrated in a similar manner).

Here, an exemplary heating temperature ranges from 80° C. to 250° C. The heating temperature is adjusted, depending on the temperature characteristics of the thermoplastic films. Moreover, an exemplary heating time ranges from three seconds to five minutes. Furthermore, the pressure applied to the thermoplastic films 141 and 142 is adjusted, depending on the shape of the forming mold 150. In addition, the heating temperature here is adjusted, depending on the thickness and the quality of material of the thermoplastic films 141 and 142, and the shape into which the thermoplastic films 141 and 142 are formed. Specifically, if the thermoplastic films 141 and 142 are thinner than approximate 200 μm, for example, the heating temperature is set between 80° C. and 180° C. inclusive. If the thermoplastic films 141 and 142 are thicker than approximate 200 μm, the heating temperature is set between 130° C. and 250° C. inclusive. Moreover, when the heating temperature is adjusted because of the shape to be formed, the heating temperature is set higher at a curved surface and a corner portion than at a flat portion, for example. This reduces flaws such as wrinkling and waviness.

Note that the thermoplastic resin alone may previously be heated up to a forming temperature so that the heating time may be reduced, and the resulting heat stress to the device layer 110 may decrease.

Figure 6C:
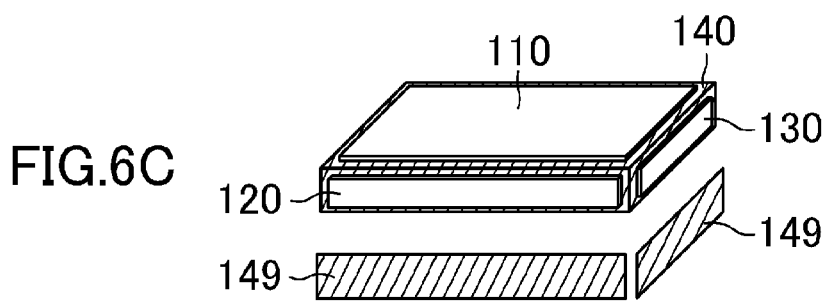

Having received a predetermined heating treatment, the thermoplastic films 141 and 142 are either left to cool to a room temperature, or cooled to the room temperature by a cooling unit. Hence, the softened thermoplastic films 141 and 142 harden again to be a housing shaped in conformity with the forming mold 150. Here, a part appearing as an edge of the housing body 140 (e.g., a part between the device layer 120 and the device layer 130) is formed of the thermoplastic films 141 and 142 that have been once melted and then bonded together when hardened again. Thus, no seam as a processing mark is left. After that, as illustrated in FIG. 6C, an extra part 149 of the housing body 140 is trimmed (Removing Step)

Figure 6D:
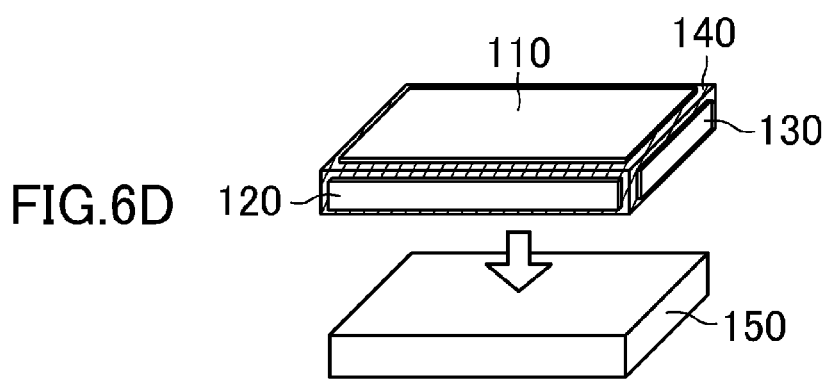
Figure 6E:
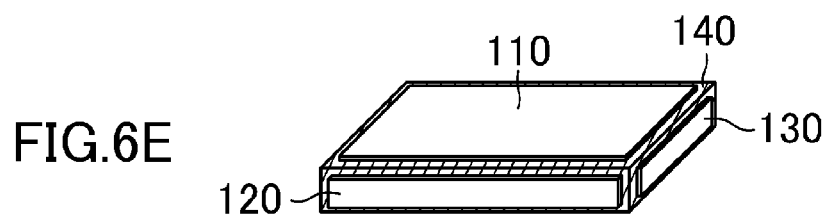

Finally, as illustrated in FIG. 6D, the forming mold 150 is removed. Hence, as illustrated in FIG. 6E, the display apparatus 100 is finished.

Effect of First Embodiment

When the display apparatus 100 is prepared using the manufacturing method according to the first embodiment, the film device FD with the device layers 110, 120, and 130 previously provided is formed to have a shape in conformity with the forming mold 150 such that the film device FD is formed into any given shape. The resulting display apparatus 100 successfully has a sophisticated design, since edge parts of the approximate cuboid shape of the display apparatus 100 (e.g., spaces between the device layer 110 and the device layer 120, between the device layer 110 and the device layer 130, and between the device layer 120 and the device layer 130) are seamless.

Modified Example of First Embodiment

Figure 7:
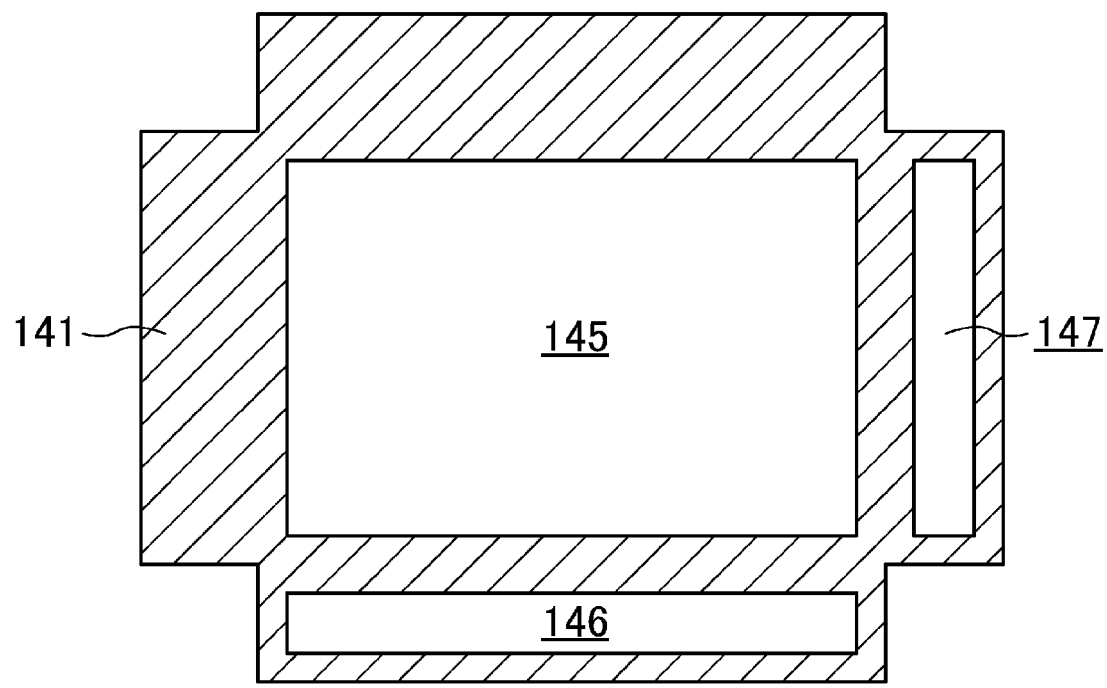
FIG. 7 illustrates an unprocessed thermoplastic film in the method for manufacturing the display apparatus according to a modified example of the first embodiment.

Parts of the thermoplastic films 141 and 142, which have already been known to overlap with the forming mold 150 when the films are placed over the forming mold 150, may previously be cut. For example, as illustrated in FIG. 7, the four corners of the rectangular thermoplastic film 141 may have been removed.

Second Embodiment

Figure 8:
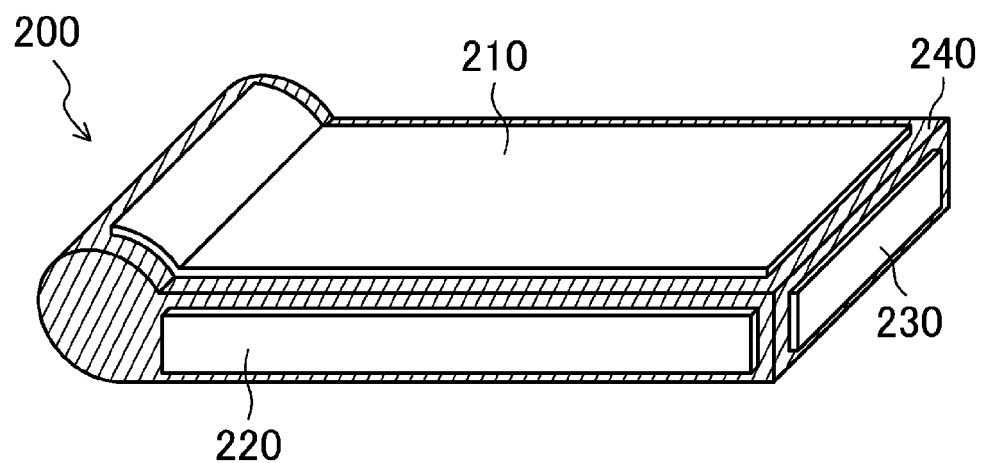
FIG. 8 is a perspective view of a display apparatus according to a second embodiment.

FIG. 8 illustrates a display apparatus 200 according to a second embodiment. This display apparatus 200 is used for smart phones, tablet PCs, and handheld game consoles, for example. The display apparatus 200 is different from the display apparatus 100 according to the first embodiment in that the display apparatus 200 includes a housing body 240 having a cuboid (i.e., on the observer's right in FIG. 8) formed of a plat plate, and a cylinder (i.e., on the observer's left in FIG. 8) connected to the cuboid. The display apparatus 200 has device layers 210, 220, and 230 provided to respective three faces out of six faces of the housing body 240 shaped into the cuboid. Note that the device layer 210 is provided to the housing body 240 across a face on the cuboid and a cylindrical face of the cylinder.

A polyimide film is formed of a similar material to that used in the first embodiment.

Similar to the configuration described in the first embodiment, each of the device layers 210, 220, and 230 is configured to have a device body stacked on the polyimide film.

As the device body, the device layer 210 includes an LCD panel having a touch panel. This LCD panel having a touch panel is similar to that according to the first embodiment.

As the device body, the device layer 220 includes an LCD panel. This LCD panel is similar to that according to the first embodiment.

As the device body, the device layer 230 includes an input device. This input device is similar to that according to the first embodiment.

The housing body 240 is embodied as thermoplastic films 241 and 242. The thermoplastic films 241 and 242 are formed of a similar material to that according to the first embodiment.

(Method for Manufacturing Display Apparatus)

Described next is a method for manufacturing the display apparatus 200 according to the second embodiment. This manufacturing method includes a preparing step, a heating step, and a removing step.

(Preparing Step)

Figure 9A:
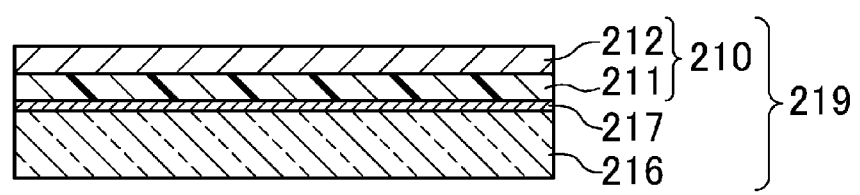
FIGS. 9A and 9B illustrate a preparing step in a method for manufacturing the display apparatus according to the second embodiment.

In a manner similar to the first embodiment, first, as illustrated in FIG. 9A, a sacrificial film 217 is formed on a supporting substrate 216 such as a glass substrate. Moreover, in similar manners, a sacrificial film 227 is formed on a supporting substrate 226 for the LCD panel, and a sacrificial film 237 is formed on a supporting substrate 236 for the input device.

After that, as illustrated in FIG. 9A, a polyimide film 211 is formed on the sacrificial film 217, in a manner similar to the first embodiment. Then, a device body 212 (i.e., an LCD panel) is formed to further cover the polyimide film 211. The device body 212 is formed by a known art. Finally obtained is a multi-layer product 219 including the supporting substrate 216, the sacrificial film 217, and the device layer 210. Obtained in a similar manner are: a multi-layer product 229 including the supporting substrate 226, the sacrificial film 227, and the device layer 220; and a multi-layer product 239 including the supporting substrate 236, the sacrificial film 237, and the device layer 230.

Figure 9B:
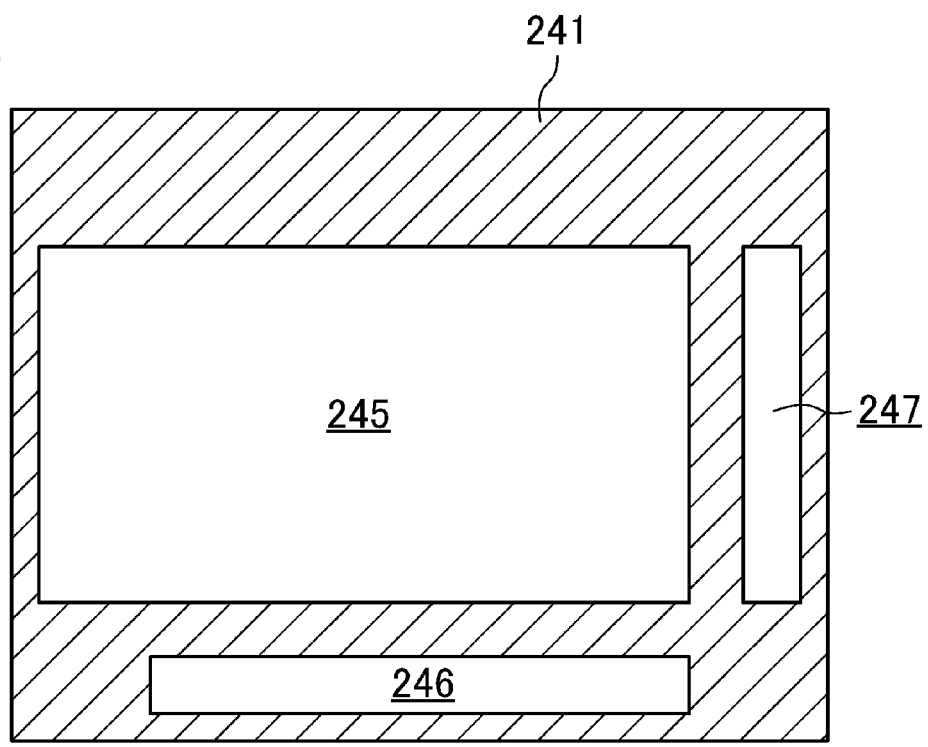

Meanwhile, a region of the thermoplastic film 241 may be colored black using pigment ink, for example. Here, the colored region is other than the regions provided with the LCD panel having a touch panel, the LCD panel, and the input device. Hence, as illustrated in FIG. 9B, regions of the thermoplastic film 241, which are to be provided with the LCD panel having a touch panel, the LCD panel, and the input device, are left as regions 245, 246, and 247.

Figure 10:
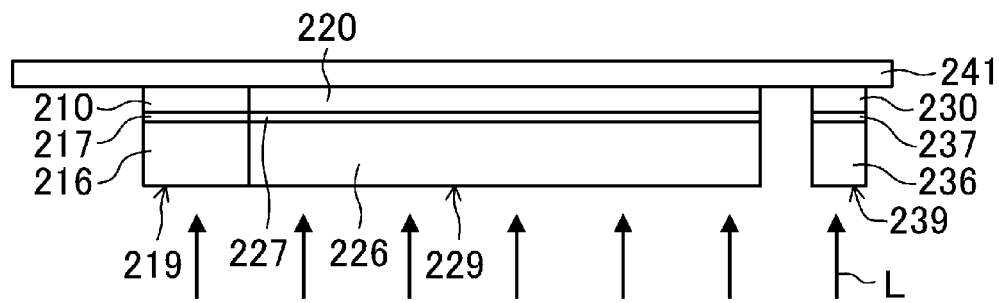
FIG. 10 illustrates the preparing step in the method for manufacturing the display apparatus according to the second embodiment.
Figure 11A:
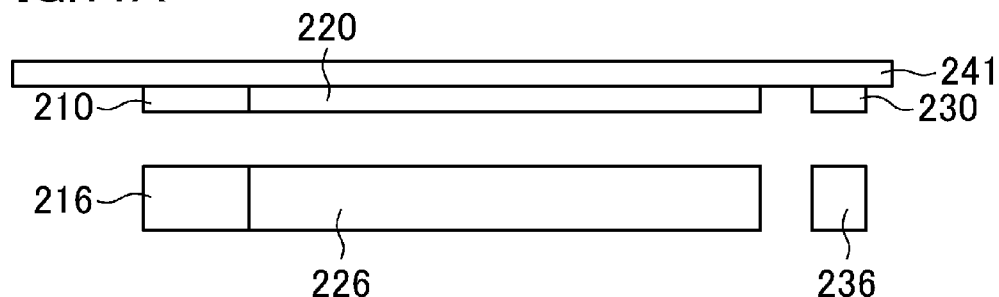
FIGS. 11A and 11B illustrate the preparing step in the method for manufacturing the display apparatus according to the second embodiment.

Next, the multi-layer products 219, 229, and 239 are respectively positioned to the regions 245, 246, and 247 of the thermoplastic film 241. Then, as illustrated in FIG. 10, the thermoplastic film 241 is applied to the surfaces of the multi-layer products 219, 229, and 239. Then, as illustrated in FIG. 10, a laser beam L is emitted onto the supporting substrates 216, 226, and 236 of the multi-layer products 219, 229, and 239. This allows for the sublimation of the sacrificial films 217, 227, and 237. Then, as illustrated in FIG. 11A, the supporting substrates 216, 226, and 236 and the sacrificial films 217, 227, and 237 are removed.

Figure 11B:
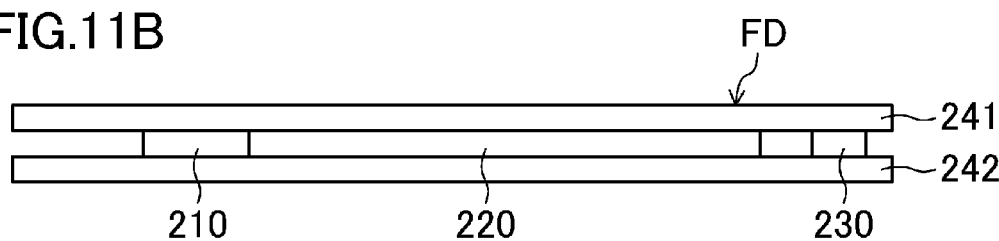

Then, as illustrated in FIG. 11B, the thermoplastic film 242 (i.e., a second thermoplastic film) is applied to multi-layer products, including the thermoplastic film 241 and the device layers 210, 220, and 230, in order to cover the device layers 210, 220, and 230. Here, the supporting substrates 216, 226, and 236, and the sacrificial films 217, 227, and 237 have been removed from the multi-layer products. Finally obtained is a film device FD embodied as the device layers 210, 220, and 230 sandwiched between the two thermoplastic films 241 and 242.

(Heating Step)

Figure 12A:
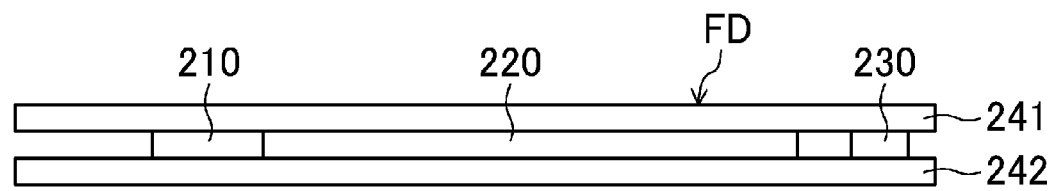
FIG. 12A illustrates a heating step and FIG. 12B illustrates a removing step in the method for manufacturing the display apparatus according to the second embodiment.
Figure 12A:
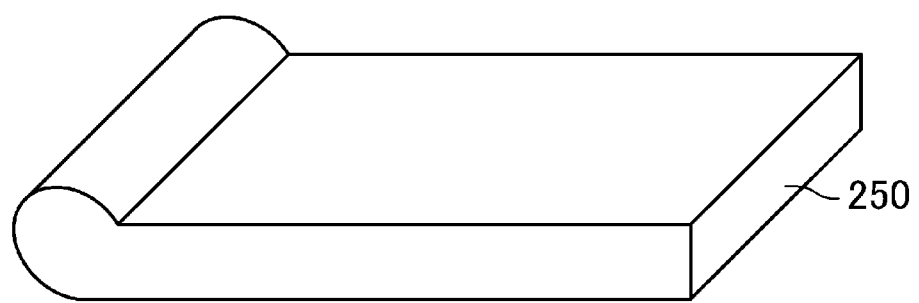

As illustrated in FIG. 12A, after the preparing step, prepared is a forming mold 250 of which the shape conforms to that of the display apparatus 200. Then, the film device FD is placed to cover the forming mold 250, and then heated and pressurized to be stretched. Here, the thermoplastic films 241 and 242 melt and soften when heated, and are formed to conform to the shape of the forming mold 250 when pressurized and pressed against the forming mold 250. Moreover, the two thermoplastic films 241 and 242 are brought together when heated. Conditions such as a heating temperature and a heating time are adjusted, depending on the temperature characteristics of the thermoplastic films and on the shape of the forming mold 250.

Having received a predetermined heating treatment, the thermoplastic films 241 and 242 are either left to cool to a room temperature, or cooled to the room temperature by a cooling unit. Hence, the softened thermoplastic films 241 and 242 harden again to be a housing shaped in conformity with the forming mold 250. Here, a part appearing as an edge of the housing body 240 (e.g., a part between the device layer 220 and the device layer 230) is formed of the thermoplastic films 241 and 242 that have been once melted and then bonded together when hardened again. Thus, no seam as a processing mark is left. After that, an extra part of the housing body 240 is trimmed (Removing Step)

Figure 12B:
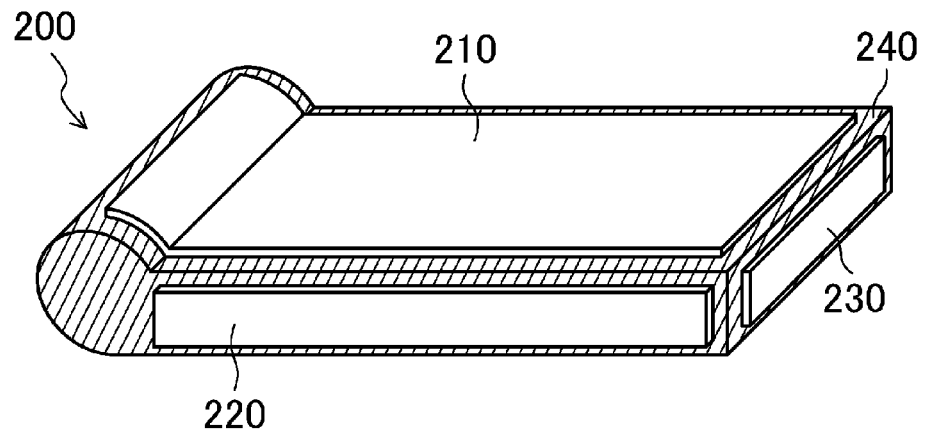

Finally, in a manner similar to the first embodiment, the forming mold 250 is removed. Hence, as illustrated in FIG. 12B, the display apparatus 200 is finished.

Effect of Second Embodiment

When the display apparatus 200 is prepared using the manufacturing method according to the second embodiment, the film device FD with the device layers 210, 220, and 230 previously provided is formed to have a shape in conformity with the forming mold 250 such that the film device FD is formed into any given shape. The resulting display apparatus 200 successfully has a sophisticated design, since edge parts of the approximate cuboid shape of the display apparatus 200 (e.g., spaces between the device layer 210 and the device layer 220, between the device layer 210 and the device layer 230, and between the device layer 220 and the device layer 230) are seamless.

Furthermore, even if the main face of the display apparatus 200 is formed into a complex shape into which a flat surface and a curved surface (i.e., a part of the cylinder) are combined together, employing the method for manufacturing the display apparatus according to the second embodiment enables providing a sheet of the device layer 210 (i.e., a display panel) across the flat surface and curved surface. In particular, the previously formed film device FD is set onto the forming mold 250 and heated so that the device layer 210 may be provided. Without a complex step, such a technique enables facilitating the manufacture of the display apparatus 200.

Third Embodiment

Figure 13:
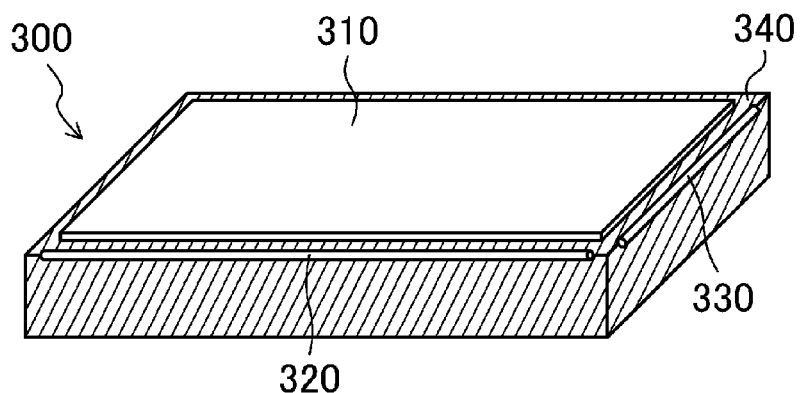
FIG. 13 is a perspective view of a display apparatus according to a third embodiment.

FIG. 13 illustrates a display apparatus 300 according to a third embodiment. This display apparatus 300 is used for smart phones, tablet PCs, and handheld game consoles, for example. Similar to the display apparatus 100 according to the first embodiment, the display apparatus 300 is shaped into an approximate cuboid. The display apparatus 300 includes a housing body 340 shaped into a cuboid. A device layer 310 is provided to the main face of the housing body 340. Device layers 320 and 330 are provided along respective two edges of a face included in the device layer 310.

A polyimide film is formed of a similar material to that used in the first embodiment.

As the device body, the device layer 310 includes an LCD panel having a touch panel. This LCD panel having a touch panel is similar to that according to the first embodiment.

As the device body, the device layers 320 and 330 include an input device. This input device is either a rod-like capacitance-type touch panel or a combination of the rod-like capacitance-type touch panel with a sensor circuit associated with the touch panel. For example, depending on an input position, the device layers 320 and 330 may be set to change the volume of output sound, to change the brightness of the screen, and to enlarge/reduce the on screen display.

The housing body 340 is embodied as thermoplastic films 341 and 342. The thermoplastic films 341 and 342 are formed of a similar material to that according to the first embodiment.

(Method for Manufacturing Display Apparatus)

Described next is a method for manufacturing the display apparatus 300 according to the third embodiment. This manufacturing method includes a preparing step, a heating step, and a removing step.

(Preparing Step)

Figure 14A:
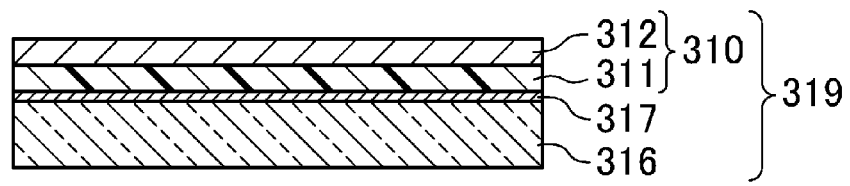
FIGS. 14A and 14B illustrate a preparing step in a method for manufacturing the display apparatus according to the third embodiment.

In a manner similar to the first embodiment, first, as illustrated in FIG. 14A, a sacrificial film 317 is formed on a supporting substrate 316 such as a glass substrate. Moreover, in a similar manner, sacrificial films 327 and 337 are respectively formed on supporting substrates 326 and 336 for the input device.

After that, as illustrated in FIG. 14A, a polyimide film 311 is formed on the sacrificial film 317, in a manner similar to the first embodiment. Then, a device body 312 (i.e., an LCD panel) is formed to further cover the polyimide film 311. The device body 312 is formed by a known art. Finally obtained is a multi-layer product 319 including the supporting substrate 316, the sacrificial film 317, and the device layer 310. Obtained in a similar manner are: a multi-layer product 329 including the supporting substrate 326, the sacrificial film 327, and the device layer 320; and a multi-layer product 339 including the supporting substrate 336, the sacrificial film 337, and the device layer 330.

Figure 14B:
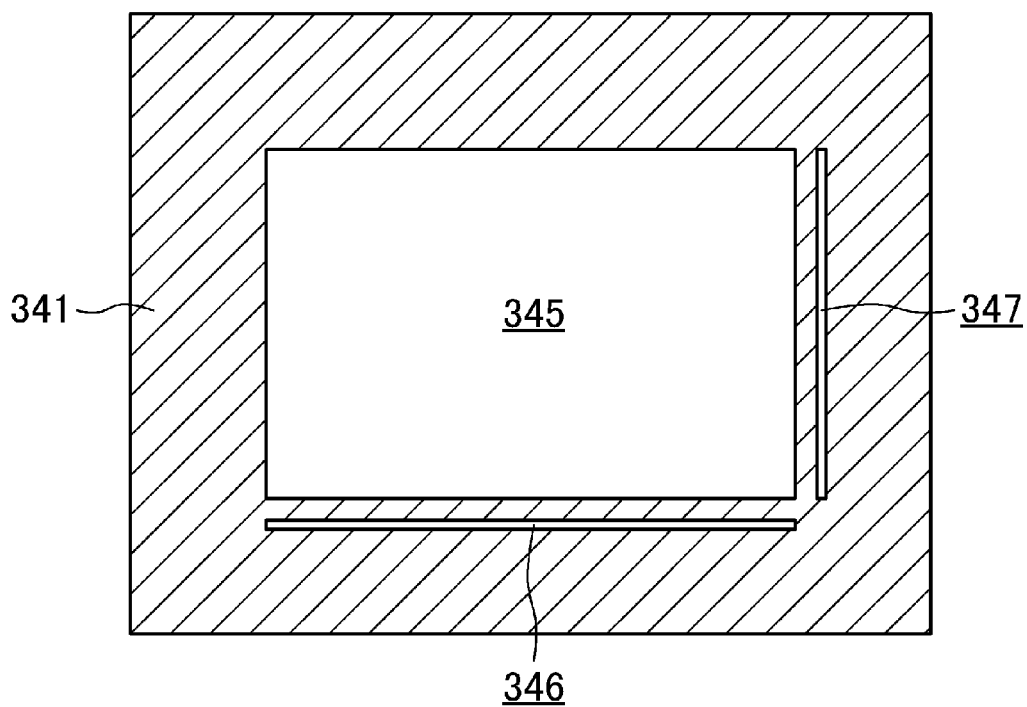

Meanwhile, a region of the thermoplastic film 341 may be colored black using pigment ink, for example. Here, the colored region is other than the regions provided with the LCD panel having a touch panel, and the input device. Hence, as illustrated in FIG. 14B, regions of the thermoplastic film 341, which are to be provided with the LCD panel having a touch panel, the LCD panel, and the input device, are left as regions 345, 346, and 347.

Figure 15:
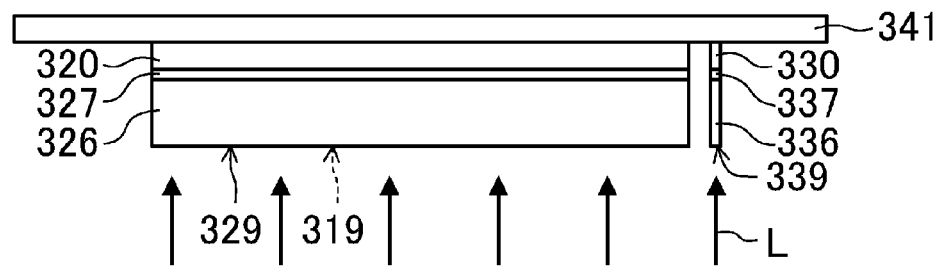
FIG. 15 illustrates the preparing step in the method for manufacturing the display apparatus according to the third embodiment.
Figure 16A:
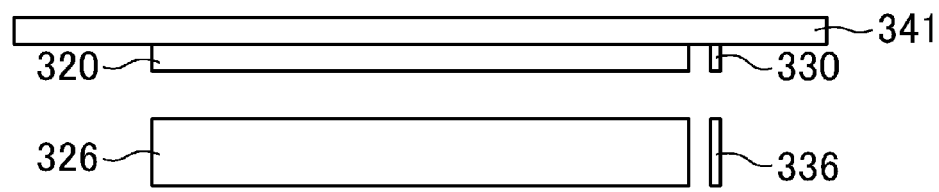
FIGS. 16A and 16B illustrate the preparing step in the method for manufacturing the display apparatus according to the third embodiment.

Next, the multi-layer products 319, 329, and 339 are respectively positioned to the regions 345, 346, and 347 of the thermoplastic film 341. Then, as illustrated in FIG. 15, the thermoplastic film 341 is applied to the surfaces of the multi-layer products 319, 329, and 339. Then, as illustrated in FIG. 15, a laser beam L is emitted onto the supporting substrates 316, 326, and 336 of the multi-layer products 319, 329, and 339 in a manner similar to the first embodiment. This allows for the sublimation of the sacrificial films 317, 327, and 337. Then, as illustrated in FIG. 16A, the supporting substrates 316, 326, and 336 and the sacrificial films 317, 327, and 337 are removed.

Figure 16B:
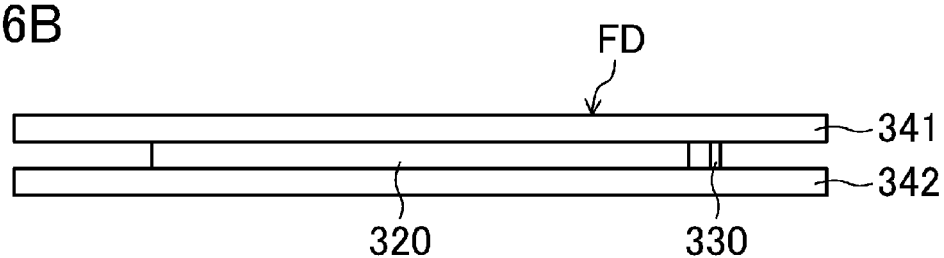

Then, as illustrated in FIG. 16B, the thermoplastic film 342 (i.e., a second thermoplastic film) is applied to multi-layer products, including the thermoplastic film 341 and the device layers 310, 320, and 330, in order to cover the device layers 310, 320, and 330. Here, the supporting substrates 316, 326, and 336, and the sacrificial films 317, 327, and 337 have been removed from the multi-layer products. Finally obtained is a film device FD embodied as the device layers 310, 320, and 330 sandwiched between the two thermoplastic films 341 and 342.

(Heating Step)

Figure 17A:
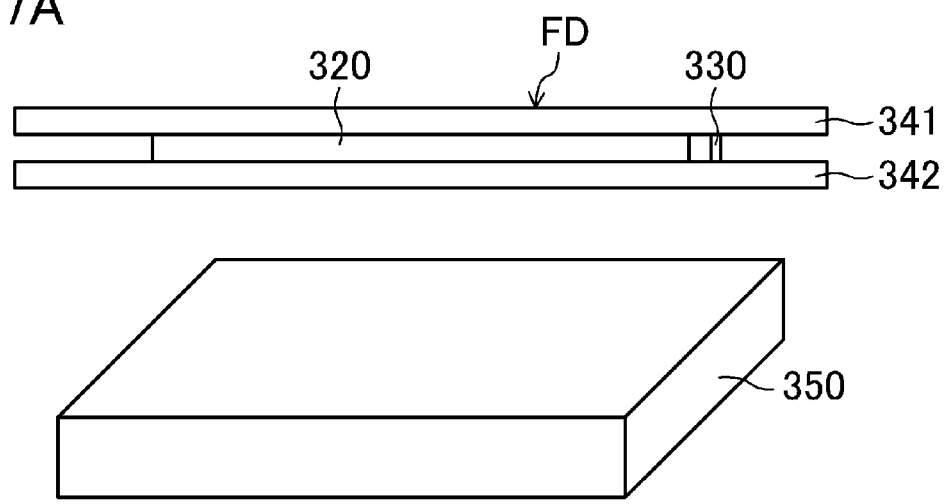
FIG. 17A illustrates a heating step and FIG. 17B illustrates a removing step in the method for manufacturing the display apparatus according to the third embodiment.

As illustrated in FIG. 17A, after the preparing step, prepared is a forming mold 350 of which the shape conforms to that of the display apparatus 300. Then, the film device FD is placed to cover the forming mold 350, and then heated and pressurized to be stretched. Here, the thermoplastic films 341 and 342 melt and soften when heated, and are formed to conform to the shape of the forming mold 350 when pressurized and pressed against the forming mold 350. Moreover, the two thermoplastic films 341 and 342 are brought together when heated. Conditions such as a heating temperature and a heating time are adjusted, depending on the temperature characteristics of the thermoplastic films and on the shape of the forming mold 350.

Having received a predetermined heating treatment, the thermoplastic films 341 and 342 are either left to cool to a room temperature, or cooled to the room temperature by a cooling unit. Hence, the softened thermoplastic films 341 and 342 harden again to be a housing shaped in conformity with the forming mold 350. Here, a part appearing as an edge of the housing body 340 (e.g., an edge part sandwiched between a face of the device layer 320 and a face of the device layer 330) is formed of the thermoplastic films 341 and 342 that have been once melted and then bonded together when hardened again. Thus, no seam as a processing mark is left. After that, an extra part of the housing body 340 is trimmed (Removing Step)

Figure 17B:
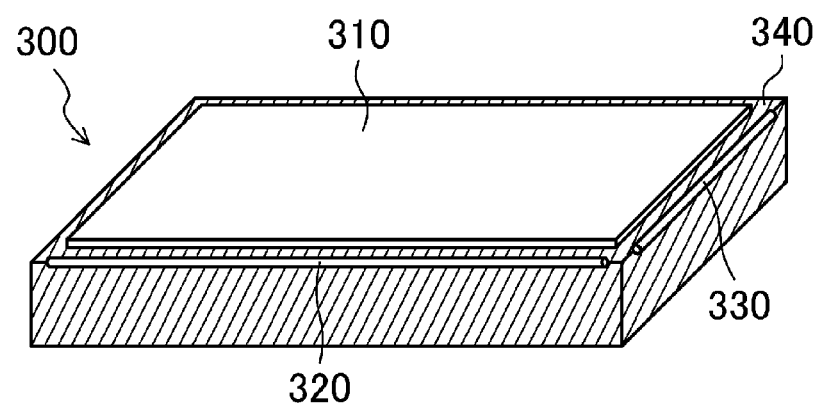

Finally, in a manner similar to the first embodiment, the forming mold 350 is removed. Hence, as illustrated in FIG. 17B, the display apparatus 300 is finished.

Effect of Third Embodiment

When the display apparatus 300 is prepared using the manufacturing method according to the third embodiment, the film device FD with the device layers 310, 320, and 330 previously provided is formed to have a shape in conformity with the forming mold 350 such that the film device FD is formed into any given shape. The resulting display apparatus 300 successfully has a sophisticated design, since an edge part of the approximate cuboid shape of the display apparatus 300 is seamless.

Furthermore, in the formation of the film device FD to be set onto the forming mold 350, the device layers 320 and 330 are positioned to a corresponding edge of the forming mold 350. Without a complex step, such a technique enables facilitating the manufacture of the display apparatus 300 having the device layers 320 and 330 arranged along the edge.

Fourth Embodiment

Figure 18:
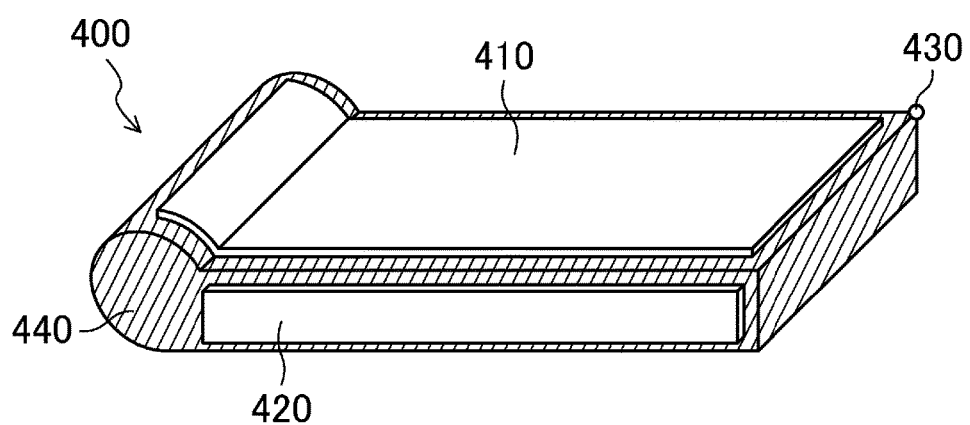
FIG. 18 is a perspective view of a display apparatus according to a fourth embodiment.

FIG. 18 illustrates a display apparatus 400 according to a fourth embodiment. This display apparatus 400 is used for smart phones, tablet PCs, and handheld game consoles, for example. Similar to the display apparatus 200 in the second embodiment, the display apparatus 400 includes a housing body 440 having a cuboid (i.e., on the observer's right in FIG. 18) formed of a plat plate, and a cylinder (i.e., on the observer's left in FIG. 18) connected to the cuboid. The display apparatus 400 has: a device layer 410 provided to the main face of the housing body 440; a device layer 420 provided to a side face adjacent to the device layer 410; and a device layer 430 provided to a corner of the face having the device layer 410.

A polyimide film is formed of a similar material to that used in the first embodiment.

As the device body, the device layer 410 includes an LCD panel having a touch panel. This LCD panel having a touch panel is similar to that according to the first embodiment.

As the device body, the device layer 420 includes an LCD panel. This LCD panel is similar to that according to the first embodiment.

As the device body, the device layer 430 includes a button input device. This input device includes a pressure sensor and a feedback circuit, for example. The device layer 430 may be used, for example, to change the volume of output sound. Exemplary settings of the device layer 430 may be that the volume is turned up when the device layer 430 is pressed straight down, and the volume is turned down when the device layer 430 is pressed with an angle.

The housing body 440 is embodied as thermoplastic films 441 and 442. The thermoplastic films 441 and 442 are formed of a similar material to that described in the first embodiment.

(Method for Manufacturing Display Apparatus)

Described next is a method for manufacturing the display apparatus 400 according to the fourth embodiment. This manufacturing method includes a preparing step, a heating step, and a removing step.

(Preparing Step)

Figure 19A:
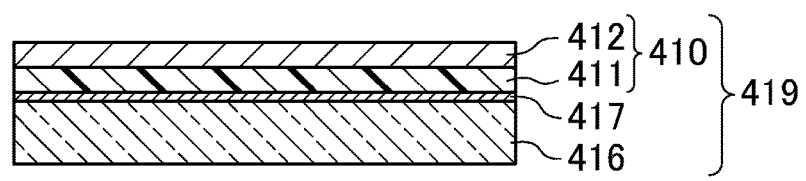
FIGS. 19A and 19B illustrate a preparing step in a method for manufacturing the display apparatus according to the fourth embodiment.

In a manner similar to the first embodiment, first, as illustrated in FIG. 19A, a sacrificial film 417 is formed on a supporting substrate 416 such as a glass substrate. Moreover, in a similar manner, sacrificial films 427 and 437 are respectively formed on supporting substrates 426 and 436 for the input device.

After that, as illustrated in FIG. 19A, a polyimide film 411 is formed on the sacrificial film 417, in a manner similar to the first embodiment. Then, a device body 412 (i.e., an LCD panel) is formed to further cover the polyimide film 411. The device body 412 is formed by a known art. Finally obtained is a multi-layer product 419 including the supporting substrate 416, the sacrificial film 417, and the device layer 410. Obtained in a similar manner are: a multi-layer product 429 including the supporting substrate 426, the sacrificial film 427, and the device layer 420; and a multi-layer product 439 including the supporting substrate 436, the sacrificial film 437, and the device layer 430.

Figure 19B:
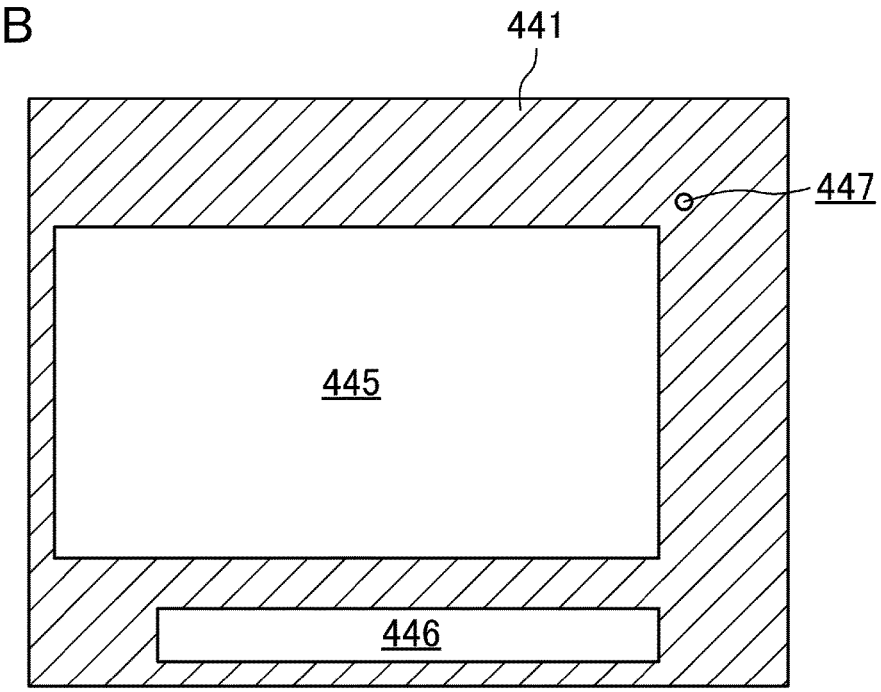

Meanwhile, a region of the thermoplastic film 441 may be colored black using pigment ink, for example. Here, the colored region is other than the regions provided with the LCD panel having a touch panel, and the input device. Hence, as illustrated in FIG. 19B, regions of the thermoplastic film 441, which are to be provided with the LCD panel having a touch panel, the LCD panel, and the input device, are left as regions 445, 446, and 447.

Figure 20:
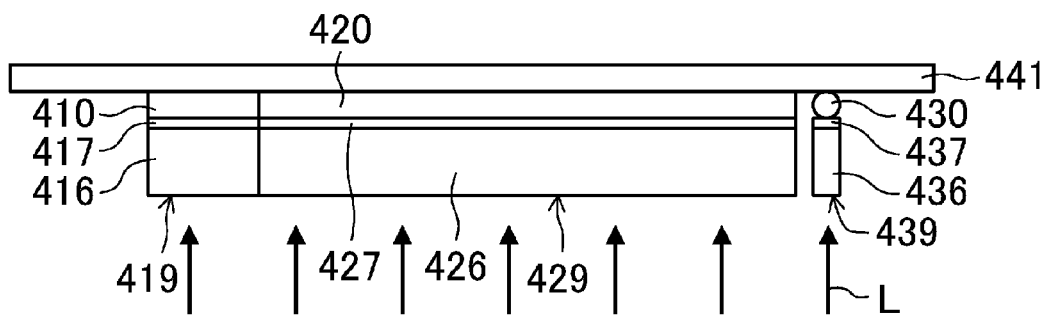
FIG. 20 illustrates the preparing step in the method for manufacturing the display apparatus according to the fourth embodiment.
Figure 21A:
FIGS. 21A and 21B illustrate the preparing step in the method for manufacturing the display apparatus according to the fourth embodiment.

Next, the multi-layer products 419, 429, and 439 are respectively positioned to the regions 445, 446, and 447 of the thermoplastic film 441. Then, as illustrated in FIG. 20, the thermoplastic film 441 is applied to the surfaces of the multi-layer products 419, 429, and 439. Then, as illustrated in FIG. 20, a laser beam L is emitted onto the supporting substrates 416, 426, and 436 of the multi-layer products 419, 429, and 439 in a manner similar to the first embodiment. This allows for the sublimation of the sacrificial films 417, 427, and 437. Then, as illustrated in FIG. 21A, the supporting substrates 416, 426, and 436 and the sacrificial films 417, 427, and 437 are removed.

Figure 21B:
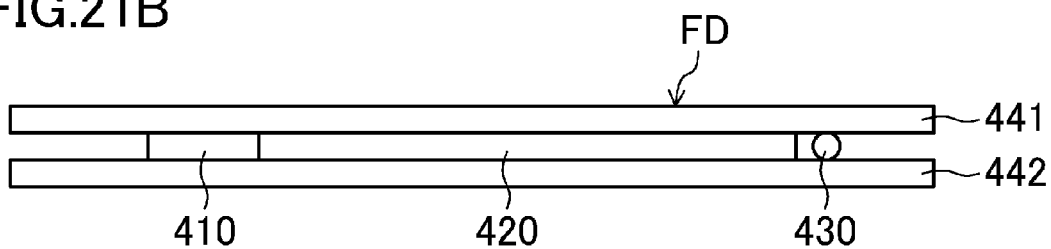

Then, as illustrated in FIG. 21B, the thermoplastic film 442 (i.e., a second thermoplastic film) is applied to multi-layer products, including the thermoplastic film 441 and the device layers 410, 420, and 430, in order to cover the device layers 410, 420, and 430. Here, the supporting substrates 416, 426, and 436, and the sacrificial films 417, 427, and 437 have been removed from the multi-layer products. Finally obtained is a film device FD including the device layers 410, 420, and 430 sandwiched between the two thermoplastic films 441 and 442.

(Heating Step)

Figure 22A:
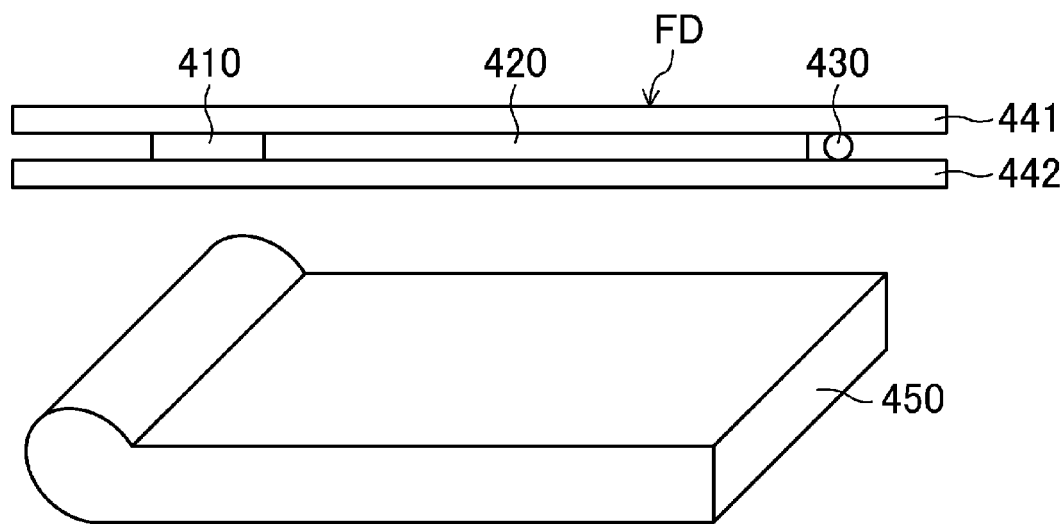
FIG. 22A illustrates a heating step and FIG. 22B illustrates a removing step in the method for manufacturing the display apparatus according to the fourth embodiment.

As illustrated in FIG. 22A, after the preparing step, prepared is a forming mold 450 of which the shape conforms to that of the display apparatus 400. Then, the film device FD is placed to cover the forming mold 450, and then heated and pressurized to be stretched. Here, the thermoplastic films 441 and 442 melt and soften when heated, and are formed to conform to the shape of the forming mold 450 when pressurized and pressed against the forming mold 450. Moreover, the two thermoplastic films 441 and 442 are brought together when heated. Conditions such as a heating temperature and a heating time are adjusted, depending on the temperature characteristics of the thermoplastic films and on the shape of the forming mold 450.

Having received a predetermined heating treatment, the thermoplastic films 441 and 442 are either left to cool to a room temperature, or cooled to the room temperature by a cooling unit. Hence, the softened thermoplastic films 441 and 442 harden again to be a housing shaped in conformity with the forming mold 450. Here, a part appearing as an edge of the housing body 440 (e.g., an edge part sandwiched between a face of the device layer 420 and a side face adjacent to the face) is formed of the thermoplastic films 441 and 442 that have been once melted and then bonded together when hardened again. Thus, no seam as a processing mark is left. After that, an extra part of the housing body 440 is trimmed (Removing Step)

Figure 22B:
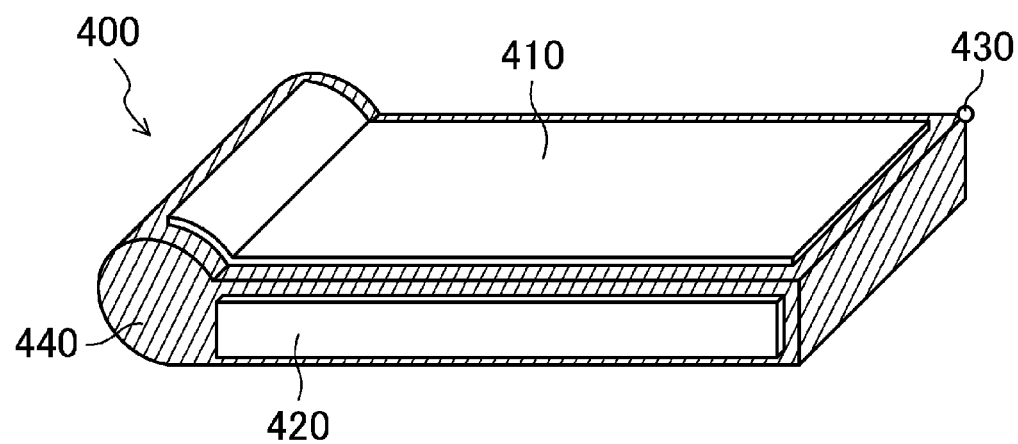

Finally, in a manner similar to the first embodiment, the forming mold 450 is removed. Hence, as illustrated in FIG. 22B, the display apparatus 400 is finished.

Effect of Fourth Embodiment

When the display apparatus 400 is prepared using the manufacturing method according to the fourth embodiment, the film device FD with the device layers 410, 420, and 430 previously provided is formed to have a shape in conformity with the forming mold 450 such that the film device FD is formed into any given shape. The resulting display apparatus 400 successfully has a sophisticated design, since an edge part of the approximate cuboid shape of the display apparatus 400 (e.g., a space between the device layer 410 and the device layer 420) is seamless.

Furthermore, in the formation of the film device FD to be set onto the forming mold 450, the device layer 430 is positioned to a corresponding corner of the forming mold 450. Without a complex step, such a technique enables facilitating the manufacture of the display apparatus 400 having the device layer 430 provided to the corner.

Furthermore, even if the main face of the display apparatus 400 is formed into a complex shape into which a flat surface and a curved surface (i.e., a part of the cylinder) are combined together, employing the method for manufacturing the display apparatus according to the fourth embodiment enables providing a sheet of the device layer 410 (i.e., a display panel) across the flat surface and curved surface. In particular, the previously formed film device FD is set onto the forming mold 450 and heated so that the device layer 410 may be provided. Without a complex step, such a method enables facilitating the manufacture of the display apparatus 400.

Fifth Embodiment

Figure 23:
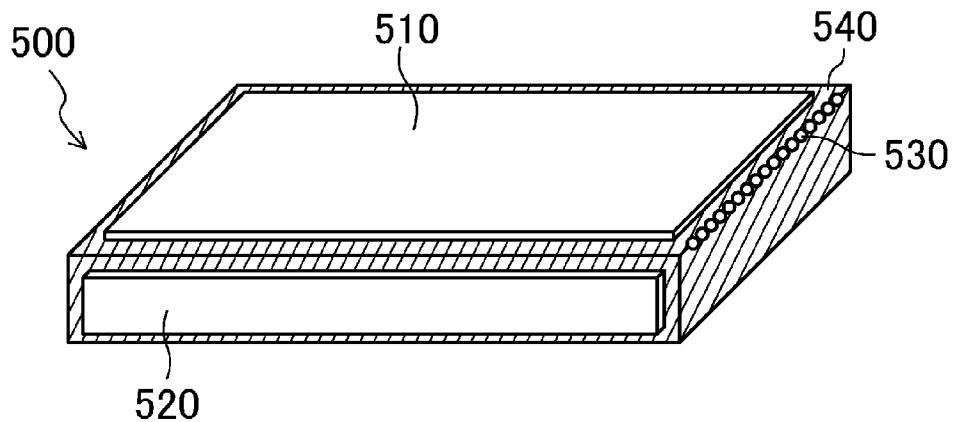
FIG. 23 is a perspective view of a display apparatus according to a fifth embodiment.

FIG. 23 illustrates a display apparatus 500 according to a fifth embodiment. This display apparatus 500 is used for smart phones, tablet PCs, and handheld game consoles, for example. Similar to the display apparatus 100 according to the first embodiment, the display apparatus 500 is shaped into an approximate cuboid. The display apparatus 500 includes a housing body 540 shaped into a cuboid. A device layer 510 is provided to the main face of the housing body 540. A device layer 520 is provided to a side face adjacent to the device layer 510. A device layer 530 is provided along an edge of the face having the device layer 510.

A polyimide film is formed of a similar material to that used in the first embodiment.

As the device body, the device layer 510 includes an LCD panel having a touch panel. This LCD panel having a touch panel is similar to that according to the first embodiment.

As the device body, the device layer 520 includes an LCD panel. This LCD panel is similar to that according to the first embodiment.

As the device body, the device layer 530 includes multiple LCDs. Each of the LEDs is spherical and has a diameter ranging from approximately 1 mm to 5 mm, for example. The LEDs glow in any given color, such as red, blue, green and white. The LEDs may operate to show any given sign by a combination of their glowing states, to indicate a signal, to glow for a decorative purpose, and to be used as a light. When the LEDs operate to indicate signals, for example, a red light may show a hardware malfunction, and red and green lights may show that the software is under debugging. Note that the indicated colors and details of the signal indications do not have to be limited to such examples. An end user may individually set his or her signal indications.

The housing body 540 is embodied as thermoplastic films 541 and 542. The thermoplastic films 541 and 542 are formed of a similar material to that according to the first embodiment.

(Method for Manufacturing Display Apparatus)

Described next is a method for manufacturing the display apparatus 500 according to the fifth embodiment. This manufacturing method includes a preparing step, a heating step, and a removing step.

(Preparing Step)

Figure 24A:
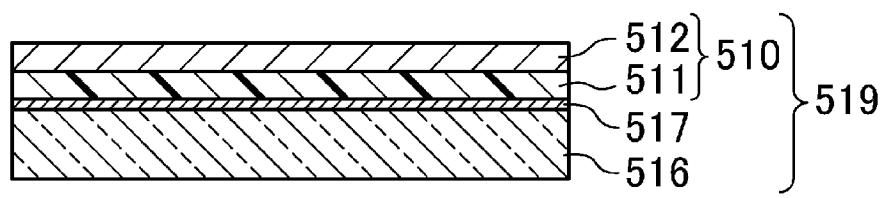
FIGS. 24A and 24B illustrate a preparing step in a method for manufacturing the display apparatus according to the fifth embodiment.

Similar to the first embodiment, first, as illustrated in FIG. 24A, a sacrificial film 517 is formed on a supporting substrate 516 such as a glass substrate. Moreover, in a similar manner, sacrificial films 527 and 537 are respectively formed on supporting substrates 526 and 536 for the input device.

After that, as illustrated in FIG. 24A, a polyimide film 511 is formed on the sacrificial film 517, in a manner similar to the first embodiment. Then, a device body 512 (i.e., an LCD panel) is formed to further cover the polyimide film 512. The device body 512 is formed by a known art. Finally obtained is a multi-layer product 519 including the supporting substrate 516, the sacrificial film 517, and the device layer 510. Obtained in a similar manner are: a multi-layer product 529 including the supporting substrate 526, the sacrificial film 527, and the device layer 520; and a multi-layer product 539 including the supporting substrate 536, the sacrificial film 537, and the device layer 530.

Figure 24B:
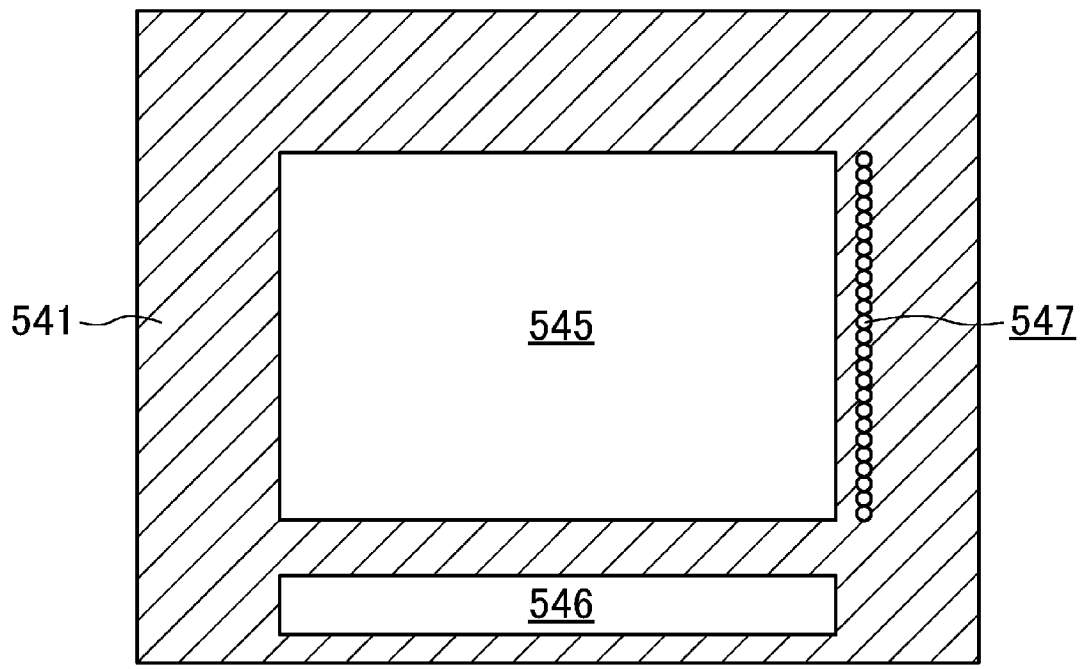

Meanwhile, a region of the thermoplastic film 541 may be colored black using pigment ink, for example. Here, the colored region is other than the regions provided with the LCD panel having a touch panel, and the input device. Hence, as illustrated in FIG. 24B, regions of the thermoplastic film 541, which are to be provided with the LCD panel having a touch panel, the LCD panel, and the input device, are left as regions 545, 546, and 547.

Figure 25:
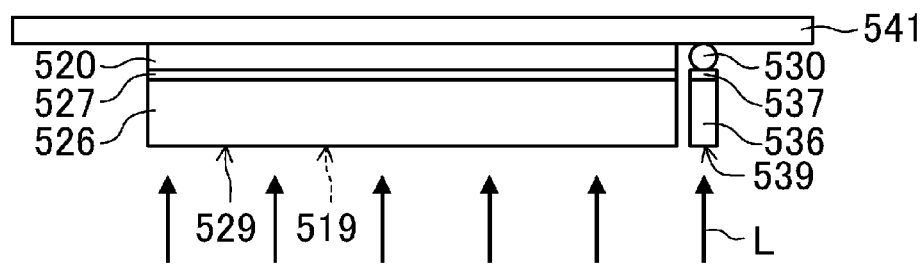
FIG. 25 illustrates the preparing step in the method for manufacturing the display apparatus according to the fifth embodiment.
Figure 26A:
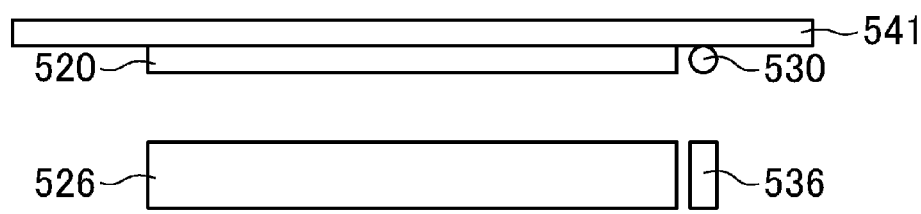
FIGS. 26A and 26B illustrate the preparing step in the method for manufacturing the display apparatus according to the fifth embodiment.

Next, the multi-layer products 519, 529, and 539 are respectively positioned to the regions 545, 546, and 547 of the thermoplastic film 541. Then, as illustrated in FIG. 25, the thermoplastic film 541 is applied to the surfaces of the multi-layer products 519, 529, and 539. Then, as illustrated in FIG. 25, a laser beam L is emitted onto the supporting substrates 516, 526, and 536 of the multi-layer products 519, 529, and 539 in a manner similar to the first embodiment. This allows for the sublimation of the sacrificial films 517, 527, and 537. Then, as illustrated in FIG. 26A, the supporting substrates 516, 526, and 536 and the sacrificial films 517, 527, and 537 are removed.

Figure 26B:
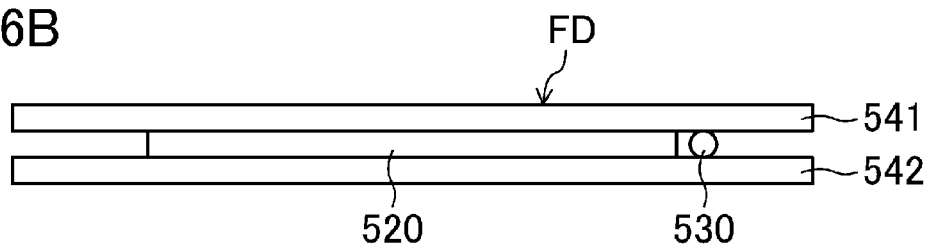

Then, as illustrated in FIG. 26B, the thermoplastic film 542 (i.e., a second thermoplastic film) is applied to multi-layer products, including the thermoplastic film 541 and the device layers 510, 520, and 530, in order to cover the device layers 510, 520, and 530. Here, the supporting substrates 516, 526, and 536, and the sacrificial films 517, 527, and 537 have been removed from the multi-layer products. Finally obtained is a film device FD including the device layers 510, 520, and 530 sandwiched between the two thermoplastic films 541 and 542.

(Heating Step)

Figure 27A:
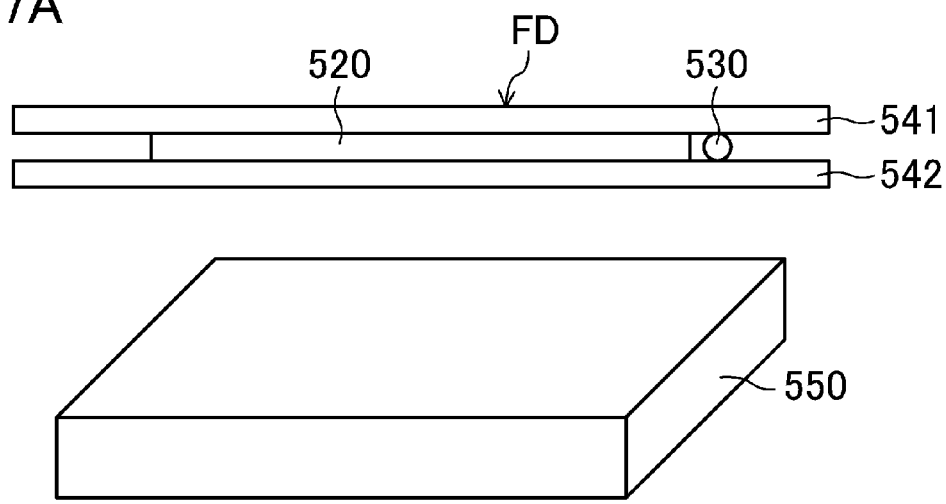
FIG. 27A illustrates a heating step and FIG. 27B illustrates a removing step in the method for manufacturing the display apparatus according to the fifth embodiment.

As illustrated in FIG. 27A, after the preparing step, prepared is a forming mold 550 of which the shape conforms to that of the display apparatus 500. Then, the film device FD is placed to cover the forming mold 550, and then heated and pressurized to be stretched. Here, the thermoplastic films 541 and 542 melt and soften when heated, and are formed to conform to the shape of the forming mold 550 when pressurized and pressed against the forming mold 550. Moreover, the two thermoplastic films 541 and 542 are brought together when heated. Conditions such as a heating temperature and a heating time are adjusted, depending on the temperature characteristics of the thermoplastic films and on the shape of the forming mold 550.

Having received a predetermined heating treatment, the thermoplastic films 541 and 542 are either left to cool to a room temperature, or cooled to the room temperature by a cooling unit. Hence, the softened thermoplastic films 541 and 542 harden again to be a housing shaped in conformity with the forming mold 550. Here, a part appearing as an edge of the housing body 540 (e.g., an edge part sandwiched between a face of the device layer 520 and a face of the device layer 530) is formed of the thermoplastic films 541 and 542 that have been once melted and then bonded together when hardened again. Thus, no seam as a processing mark is left. After that, an extra part of the housing body 540 is trimmed (Removing Step)

Figure 27B:
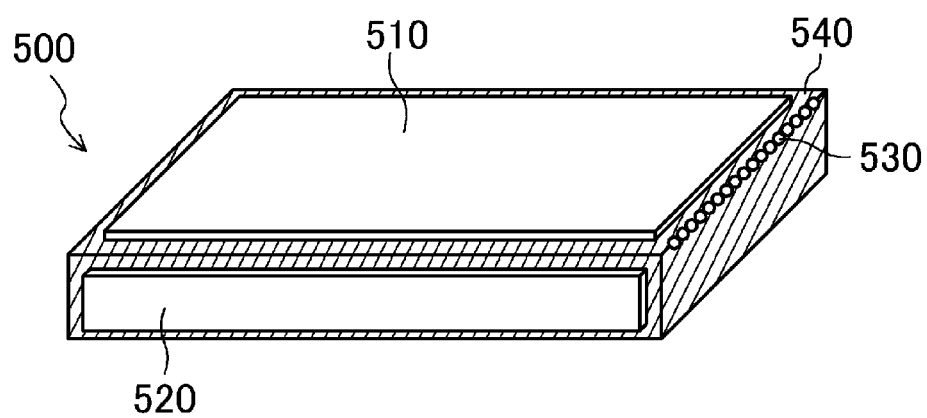

Finally, in a manner similar to the first embodiment, the forming mold 550 is removed. Hence, as illustrated in FIG. 27B, the display apparatus 500 is finished.

Effect of Fifth Embodiment

When the display apparatus 500 is prepared using the manufacturing method according to the fifth embodiment, the film device FD with the device layers 510, 520, and 530 previously provided is formed to have a shape in conformity with the forming mold 550 such that the film device FD is formed into any given shape. The resulting display apparatus 500 successfully has a sophisticated design, since an edge part of the approximate cuboid shape of the display apparatus 500 (e.g., a space between the device layer 510 and the device layer 520) is seamless.

Furthermore, in the formation of the film device FD to be set onto the forming mold 550, the device layer 530 is positioned to a corresponding edge of the forming mold 550. Without a complex step, such a technique enables facilitating the manufacture of the display apparatus 500 having the device layer 530 arranged along the edge.

Sixth Embodiment

Figure 28:
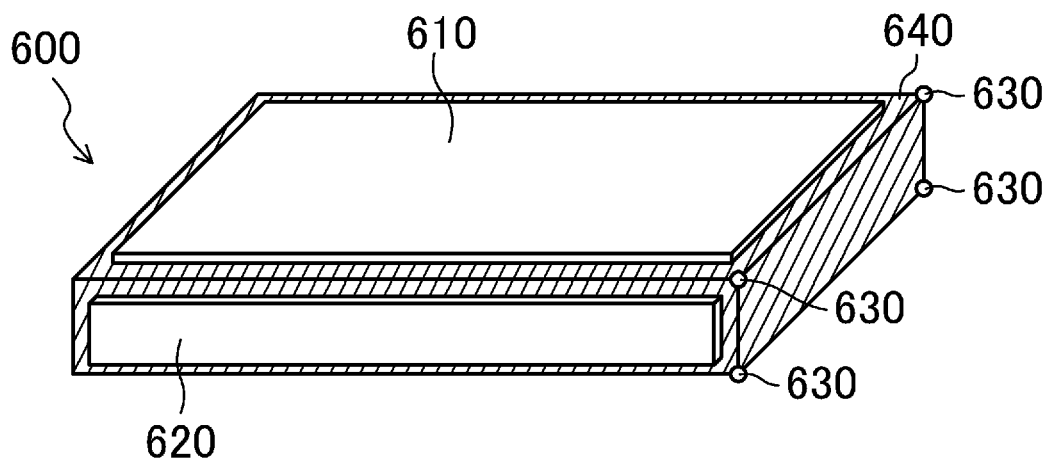
FIG. 28 is a perspective view of a display apparatus according to a sixth embodiment.

FIG. 28 illustrates a display apparatus 600 according to a sixth embodiment. This display apparatus 600 is used for smart phones, tablet PCs, and handheld game consoles, for example. Similar to the display apparatus 100 according to the first embodiment, the display apparatus 600 is shaped into an approximate cuboid. The display apparatus 600 includes a housing body 640 shaped into a cuboid. A device layer 610 is provided to the main face of the housing body 640. A device layer 620 is provided to a side face adjacent to the device layer 610. Dot-like device layers 630 are provided to the respective four corners of a face adjacent to both the device layers 610 and 620.

A polyimide film is formed of a similar material to that used in the first embodiment.

As the device body, the device layer 610 includes an LCD panel having a touch panel. This LCD panel having a touch panel is similar to that according to the first embodiment.

As the device body, the device layer 620 includes an LCD panel. This LCD panel is similar to that according to the first embodiment.

As the device body, the device layers 630 include four LEDs acting as an input device. This input device is similar to that according to the fifth embodiment. The LEDs glow in any given color, such as red, blue, green and white.

The housing body 640 is embodied as thermoplastic films 641 and 642. The thermoplastic films 641 and 642 are formed of a similar material to that described in the first embodiment.

The display apparatus 600 may be manufactured by a similar method to that described in the fifth embodiment, except that the device layers 630 (i.e., LEDs) are different in location to be provided from the device layer 530 according to the fifth embodiment.

Effect of Sixth Embodiment

In the display apparatus 600 according to the sixth embodiment, a film device FD with the device layers 610, 620, and 630 previously provided is formed to have a shape in conformity with a forming mold 650 such that the film device FD is formed into any given shape. The resulting display apparatus 600 successfully has a sophisticated design, since an edge part of the approximate cuboid shape of the display apparatus 600 (e.g., a space between the device layer 610 and the device layer 620) is seamless.

Furthermore, in the formation of the film device FD to be set onto the forming mold 650, the device layers 630 are positioned to the corresponding corners of the forming mold 650. Without a complex step, such a technique enables facilitating the manufacture of the display apparatus 600 having the device layers 630 provided to the respective corners.

Seventh Embodiment

Figure 29:
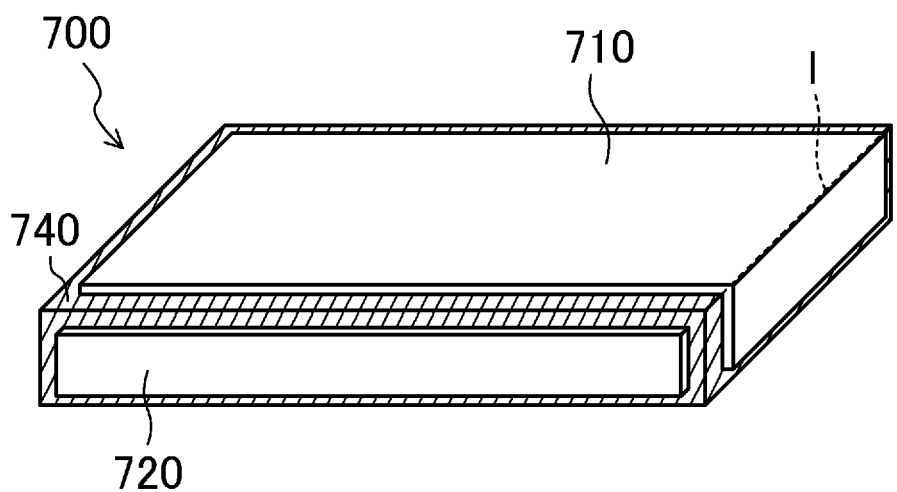
FIG. 29 is a perspective view of a display apparatus according to a seventh embodiment.

FIG. 29 illustrates a display apparatus 700 according to a seventh embodiment. This display apparatus 700 is used for smart phones, tablet PCs, and handheld game consoles, for example. Similar to the display apparatus 100 according to the first embodiment, the display apparatus 700 is shaped into an approximate cuboid. The display apparatus 700 includes a housing body 740 shaped into a cuboid. A device layer 710 is provided to cover the main face of the housing body 740 and a side face adjacent to the main face. A device layer 720 is provided to a face adjacent to the two faces having the device 710.

A polyimide film is formed of a similar material to that used in the first embodiment.

As the device body, the device layer 710 includes an organic electroluminescence (EL) display panel having a touch panel. This organic EL display panel having a touch panel may include an LCD panel and a touch panel stacked together. Here, the LCD display may include pixels each driven by a thin-film transistor (TFT). The TFT, the organic EL display panel, and the touch panel may be configured, using a well-known technique. Note that it is beneficial to ensure the reliability and the stability in operation and display for a part, of the organic EL display panel, at which the device layer 710 is folded (see the broken line 1 in FIG. 29), using techniques such as widening metal wiring and providing backup wiring. In a similar manner, it is beneficial to ensure the reliability and the stability in operation and display for a part, of the touch panel, at which the device layer 710 is folded (see the broken line 1 in FIG. 29), using techniques such as widening metal wiring, providing backup wiring, and lowering wiring density than other parts.

As the device body, the device layer 720 includes an input device. This input device may be a touch panel as seen in the first embodiment. The input device may also be a pressure-sensitive device, or a button.

The housing body 740 is embodied as thermoplastic films 741 and 742. The thermoplastic films 741 and 742 are formed of a similar material to that described in the first embodiment.

The display apparatus 700 may be manufactured by a similar method to that for manufacturing the display apparatus 100 according to the first embodiment.

Effect of Seventh Embodiment

In the display apparatus 700 according to the seventh embodiment, a film device FD with the device layers 710, 720, and 730 previously provided is formed to have a shape in conformity with a forming mold 750 such that the film device FD is formed into any given shape. The resulting display apparatus 700 successfully has a sophisticated design, since an edge part of the approximate cuboid shape of the display apparatus 700 (e.g., a space between the device layer 710 and the device layer 720) is seamless.

Moreover, the film device FD is set onto the forming mold 750 and heated, and then the thermoplastic films 741 and 742 are stretched to be the device layer 710. This allows the device layer 710 to have a folded part at the edge 1 across two orthogonal flat surfaces.

Modified Example of Seventh Embodiment

In the seventh embodiment, the device layer 720 includes the input device as the device body. However, the device body included in the device layer 720 may be the display apparatus.

Note that, it is beneficial to use polymer-network cholesteric liquid crystal if the LCD panel is included as the display panel of the device layer 710, since the display panel is folded—that is, since the cell gap to the display panel varies—in the formation of the device layer 710. In this case, too, it is beneficial to ensure the reliability and the stability in operation and display for the folded part of the panel, using techniques such as widening metal wiring, and providing backup wiring.

Other Modified Examples

In the first to seventh embodiments, the film device FD is configured to have a device layer sandwiched between two thermoplastic films. However, the second thermoplastic film is not necessarily required as long as the device layer is heat resistant or meets a sufficient strength condition.

In the second and fourth embodiments, each of the device layers 210 and 410 is provided to a face with the combination of a flat surface and a curved surface. Other than the shape with the combination of the flat surface and the curved surface, the present invention allows the device layers to be formed to have a curved surface with a complex shape including a part of a spherical surface and two or more bent axes.

In the third to sixth embodiments, the rod-like input devices and LEDs are provided to corresponding edges and corners of the display apparatuses. However, for example, a display panel (e.g., an organic EL display panel) may be provided to a corresponding edge and corner of the display apparatuses.

INDUSTRIAL APPLICABILITY

The present invention is useful in a method for manufacturing a display apparatus having a display panel of which the shape reflects various designs.

DESCRIPTION OF REFERENCE CHARACTERS

FD Film Device
100, 200 Display Apparatus
110, 210 Multi-Layer Product Including Polyimide film and Device Layer 111 Polyimide Film
112 Device Layer
116, 216 Supporting Substrate
117, 217 Sacrificial Film
120, 220 Multi-Layer Product Including Polyimide film and Device Layer
126, 226 Supporting Substrate
127, 227 Sacrificial Film
130, 230 Multi-Layer Product Including Polyimide film and Device Layer
136, 236 Supporting Substrate
137, 237 Sacrificial Film
141, 241 First Thermoplastic Film
142, 242 Second Thermoplastic Film
150, 250 Forming Mold

The invention claimed is:

1. A method for manufacturing a display apparatus, the method comprising:
preparing a film device including a device layer arranged on a first thermoplastic film, the device layer being a multi-layer product including a polyimide film and a device body, and the polyimide film being sandwiched between the device body and the first thermoplastic film;
heating the first thermoplastic film of the film device while the first thermoplastic film is pressed against a forming mold, so as to stretch the first thermoplastic film to conform to a shape of the forming mold; and
removing the forming mold from the first thermoplastic film of the film device, wherein
the heating is performed at a heating temperature lower than a temperature limit of the polyimide film, and
the heating temperature is higher at a curved surface and a corner portion of the first thermoplastic film than at a flat portion of the first thermoplastic film based on the shape of the forming mold.

2. The method of claim 1, wherein
the preparing includes:
sequentially forming and stacking a sacrificial film, the polyimide film, and the device body on a supporting substrate;
removing the supporting substrate and the sacrificial film from the device layer, through emission of a laser beam onto the sacrificial film; and
applying the first thermoplastic film to the polyimide film of the device layer.

3. The method of claim 1, wherein the film device further includes a second thermoplastic film such that the device layer is sandwiched between the first and second thermoplastic films.

4. The method of claim 1, wherein the heating is performed at a temperature ranging from 80° C. to 250° C.

5. The method of claim 4, wherein when the first thermoplastic film is thinner than about 200 μm, the heating temperature is between about 80° C. and about 180° C. inclusive.

6. The method of claim 4, wherein when the first thermoplastic film is thicker than about 200 μm, the heating temperature is between about 130° C. and about 250° C. inclusive.

7. The method of claim 1, wherein the first thermoplastic film is formed of one of polyethylene, polypropylene, polyvinyl chloride, polystyrene, styrene-acrylonitrile copolymer, acrylonitrile butadiene styrene copolymer, polyethylene terephthalate, polymethylmethacrylate, methacrylate styrene copolymer, acetylcellulose, polyvinyl alcohol, polyvinylidene chloride, and polycarbonate.

8. The method of claim 1, wherein the device layer is provided to two regions of the first thermoplastic film, each of the two regions corresponding to one of two adjacent faces of the forming mold.

9. The method of claim 1, wherein the device layer is provided to one region of the first thermoplastic film, the one region corresponding to two adjacent faces of the forming mold.

10. The method of claim 1, wherein the device layer is provided to a region of the first thermoplastic film, the region corresponding to an edge of the forming mold.

11. The method of claim 1, wherein the device layer is provided to a region of the first thermoplastic film, the region corresponding to a corner of the forming mold.

12. The method of claim 1, wherein the device layer is a liquid crystal display panel.

13. The method of claim 1, wherein the device layer is an organic electroluminescence (EL) display panel.

14. The method of claim 1, wherein the device layer is a touch panel.

15. The method of claim 1, wherein the device layer is a light-emitting diode (LED).

16. A display apparatus prepared based on the method of claim 1.

* * * * *